US012584973B2

(12) United States Patent
Na et al.

(10) Patent No.: US 12,584,973 B2
(45) Date of Patent: Mar. 24, 2026

(54) APPARATUS AND METHOD FOR DETECTING DEFECTIVE BATTERY CELL

(71) Applicant: SK On Co., Ltd., Seoul (KR)

(72) Inventors: Ji Won Na, Daejeon (KR); Jae Ram Kim, Daejeon (KR); Sang Won Bae, Daejeon (KR); Ji Hee Bae, Daejeon (KR); Yeon Hwa Song, Daejeon (KR); Ki Joo Eom, Daejeon (KR); Myung Ro Lee, Daejeon (KR); Jae Yeong Lee, Daejeon (KR); Hyun Joong Jang, Daejeon (KR)

(73) Assignee: SK On Co., Ltd., Seoul (KR)

( * ) Notice: Subject to any disclaimer, the term of this patent is extended or adjusted under 35 U.S.C. 154(b) by 139 days.

(21) Appl. No.: 18/393,683

(22) Filed: Dec. 22, 2023

(65) Prior Publication Data

US 2024/0241188 A1     Jul. 18, 2024

(30) Foreign Application Priority Data

Jan. 12, 2023     (KR) ........................ 10-2023-0004947

(51) Int. Cl.
| | |
|---|---|
| *G01R 31/396* | (2019.01) |
| *G01R 31/3842* | (2019.01) |
| *H01M 10/42* | (2006.01) |
| *H02J 7/00* | (2006.01) |

(52) U.S. Cl.
CPC ....... *G01R 31/396* (2019.01); *G01R 31/3842* (2019.01); *H01M 10/4285* (2013.01); *H02J 7/0048* (2020.01)

(58) Field of Classification Search
None
See application file for complete search history.

(56) References Cited

U.S. PATENT DOCUMENTS

| | | | |
|---|---|---|---|
| 2009/0102421 A1* | 4/2009 | Imai ...................... | H02J 7/0014 |
| | | | 320/122 |
| 2016/0268648 A1* | 9/2016 | Ueno .................... | H01M 4/043 |
| 2020/0025832 A1* | 1/2020 | Cho ...................... | G01R 31/392 |
| 2020/0300921 A1* | 9/2020 | Chang ................ | G01R 31/3828 |
| 2021/0399347 A1* | 12/2021 | Yamafuku ......... | H01M 10/0431 |

FOREIGN PATENT DOCUMENTS

| | | |
|---|---|---|
| JP | 6885236 B | 6/2021 |
| KR | 10-1779245 B1 | 9/2017 |
| KR | 10-1989491 B1 | 6/2019 |
| KR | 10-2391533 B1 | 4/2022 |

* cited by examiner

*Primary Examiner* — Jas A Sanghera
(74) *Attorney, Agent, or Firm* — IP & T GROUP LLP

(57)     ABSTRACT

An apparatus and method for detecting a defective battery cell is proposed. The proposed apparatus includes a charger for supplying current to cause a battery cell to maintain a constant voltage, a measurement part for measuring the voltage and current of the battery cell, and a controller for determining whether a defect exists in the battery cell on the basis of the current measured by the measurement part, whereby the defective battery cell may be detected with high accuracy, a time required for the detection may be shortened, and a space required for the detection may also be reduced.

14 Claims, 21 Drawing Sheets

< measuring voltage >          < measuring current >

| | normal battery cell | defective battery cell |
|---|---|---|
| charge current (μA) | XX | YY | preparation step — S10 charging to test SOC — S11 allowing rest with
test rest conditions — S12 adjusting environment
temperature to test temperature — S13 preparing measurement part
with test resistance — S14 connection step — S21 test step — S22 determination step — S23

APPARATUS AND METHOD FOR DETECTING DEFECTIVE BATTERY CELL

CROSS REFERENCE TO RELATED APPLICATION

This patent document claims the priority and benefits of Korean Patent Application No. 10-2023-0004947, filed Jan. 12, 2023, the entire contents of which are incorporated herein by reference for all purposes.

TECHNICAL FIELD

The disclosed technology relates to an apparatus and method for detecting a defective battery cell.

BACKGROUND

Technology for secondary batteries capable of charging and discharging is developing. The secondary batteries may have defects that occur during a manufacturing process thereof. A defective battery cell may degrade the performance of the entire battery module and cause a decrease in the service life of the battery module. A storage evaluation method exists as a method for determining whether a battery cell has a defect or not before the battery cell is sold. The storage evaluation method stores a charged battery cell for a long period of time and then determines whether there is a defect in the battery cell on the basis of the amount of a voltage drop.

SUMMARY

The disclosed technology provides an apparatus and method for detecting a defective battery cell by measuring electric current discharged from the inside of a battery cell.

In an aspect of the disclosed technology, an apparatus for detecting a defective battery cell, the apparatus include: a charger for supplying current to cause a battery cell to maintain a constant voltage; a measurement part for measuring the voltage and current of the battery cell; and a controller for determining whether a defect exists in the battery cell on the basis of the current measured by the measurement part.

In an embodiment, a test SOC of the battery cell may be between 20% and 40%.

In an embodiment, a test temperature of the battery cell may be between 20° C. and 30° C.

In an embodiment, a series resistance between the battery cell and the measurement part may be 1Ω or more.

In an embodiment, the battery cell may be charged to the test SOC and then allowed to rest at the test temperature for 12 to 24 hours.

In an embodiment, the controller may determine that the defect exists in the battery cell in a case where a current magnitude measured by the measurement part is greater than a reference value.

In an embodiment, the controller may store current magnitudes measured by the measurement part over time and determine that the defect exists in the battery cell in a case where a difference greater than or equal to a predetermined standard occurs by a comparison with an electric current graph of a normal battery cell.

In an aspect of the disclosed technology, a method for detecting a defective battery cell, the method include: connecting a battery cell to a charger and a measurement part; testing for supplying current, by the charger, to cause the battery cell to maintain a constant voltage and measuring the current charged in the battery cell by the measurement part; and determining, by a controller, whether a defect exists in the battery cell on the basis of the current measured by the measurement part.

In an embodiment, the method may further include, before the connecting a battery cell, preparing for charging the battery cell to a test SOC between 20% and 40%.

In an embodiment, the method may further include, before the connecting a battery cell, preparing for adjusting a test temperature of the battery cell to between 20° C. and 30° C.

In an embodiment, the method may further include, before the connecting a battery cell, preparing a series resistance between the battery cell and the measurement part to be 1Ω or more.

In an embodiment, the method may further include, before the connecting a battery cell, preparing for allowing the battery cell to rest at the test temperature for 12 to 24 hours after charging the battery cell to the test SOC.

In an embodiment, in the determining whether a defect exists, the controller may determine that the defect exists in the battery cell in a case where a current magnitude measured by the measurement part is greater than a reference value.

In an embodiment, in the determining whether a defect exists, the controller may store current magnitudes measured by the measurement part over time, and determine that the defect exists in the battery cell in a case where a difference greater than or equal to a predetermined standard occurs by a comparison with an electric current graph of a normal battery cell.

The features and advantages of the disclosed technology will become more apparent from the following detailed description based on the accompanying drawings.

Prior to this, the terms or words used in the specification and claims are not to be construed to their ordinary and dictionary meanings, and should be interpreted as meanings and concepts corresponding to the technical spirit of the disclosed technology based on the principle that inventors may properly define the concept of the terms in order to best describe their embodiments.

In some embodiment of the disclosed technology, a defective battery cell may be detected with high accuracy.

In some embodiment of the disclosed technology, a time required to detect the defective battery cell may be shortened.

In some embodiment of the disclosed technology, a space required to detect the defective battery cell may be reduced.

DETAILED DESCRIPTION

Figure 1:
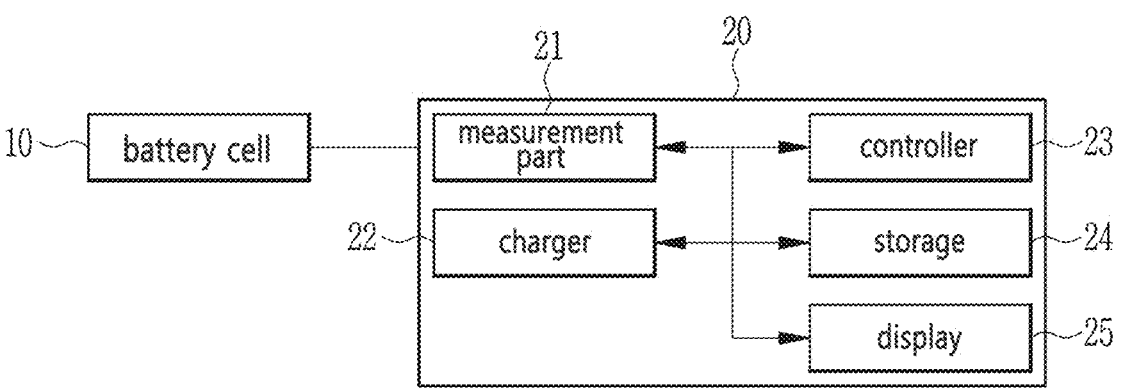
FIG. 1 shows an example of an apparatus for detecting a defective battery cell based on an embodiment.

Objectives, advantages, and features of the present disclosure will become more apparent from the following detailed description taken in conjunction with the accompanying drawings and preferred embodiments, but the present disclosure is not necessarily limited thereto. In addition, in describing the present disclosure, when it is determined that a detailed description of a related known technology may unnecessarily obscure the subject matter of the present disclosure, the detailed description thereof will be omitted.

In assigning reference numerals to components of the drawings, it should be noted that the same components are given the same reference numerals as much as possible even when they are shown in different drawings, and similar reference numerals are given to similar components.

The terminology used to describe embodiments of the present disclosure is not intended to limit the present disclosure. It should be noted that expressions in singular may include expressions in plural unless the context clearly indicates otherwise.

In the present document, expressions such as "has", "may have", "comprises", "may comprise", "includes", or "may include" indicate the presence of corresponding characteristics (e.g., a numerical value, function, operation, or component such as a part), and does not exclude the presence of additional characteristics.

Terms such as "one", "other", "another", "first", "second", etc. are used to distinguish one component from another, and components are not limited by the above terms.

The embodiments described in the present document and the accompanying drawings are not intended to limit the present disclosure to specific embodiments. It should be understood that the present disclosure includes various modifications, equivalents, and/or alternatives of the embodiments.

Hereinafter, some embodiments of the disclosed technology will be described in detail with reference to the accompanying drawings.

FIG. 1 shows an example of an apparatus 20 for detecting a defective battery cell based on an embodiment.

The apparatus 20 for detecting a defective battery cell according to the embodiment may include: a charger 22 for supplying charge current to cause a battery cell 10 to maintain a constant voltage; a measurement part 21 for measuring the voltage and current of the battery cell 10; and a controller 23 for determining whether or not a defect exists in the battery cell 10 on the basis of the current measured by the measurement part. The apparatus 20 for detecting a defective battery cell may further include: a storage 24 for storing data to perform a method for detecting a defective battery cell; and a display 25 for displaying a test result of the battery cell 10. The charger 22, measurement part 21, controller 23, storage 24, and display 25 may be connected to each other to enable data transmission and reception. The apparatus 20 for detecting a defective battery cell may further include an input part (not shown) through which a user may input an instruction or data.

The charger 22 may charge a battery cell 10 with current. The charger 22 may charge the battery cell 10 by using a constant voltage method so that the battery cell 10 maintains a constant voltage. The charger 22 may receive electric power from an external power source. The charger 22 may change charging voltage, charge current, and charging methods under the control of the controller 23.

The measurement part 21 may measure voltage and current of a battery cell 10. The measurement part 21 may transmit the measured voltage to the charger 22. The measurement part 21 may transmit the measured current to the controller 23. The measurement part 21 and the battery cell 10 may be connected in series. The measurement part 21 may measure a magnitude of current charged in the battery cell 10.

The controller 23 may determine whether a defect exists in the battery cell 10 on the basis of the current measured by the measurement part 21. In a case where the defect exists inside the battery cell 10, a leakage current exists. When the leakage current exists, a magnitude of charge current of the battery cell 10 increases. The controller 23 may determine that the defect exists when the charge current of the battery cell 10 is large.

Figure 2:
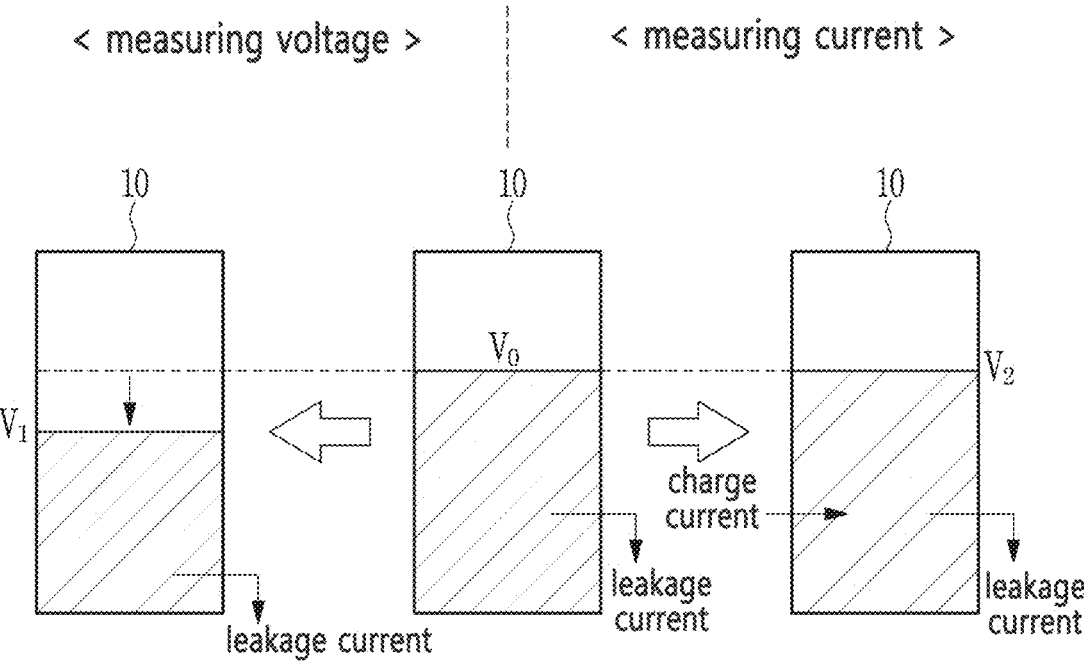
FIG. 2 shows a voltage measurement method based on a comparative example and an electric current measurement method based on an embodiment by a comparison therebetween.

FIG. 2 shows an example of a voltage measurement method according to a comparative example and an electric current measurement method based on an embodiment by a comparison therebetween.

During a manufacturing or assembly process of an anode, separator, and cathode of a battery cell 10, a defect may occur inside the battery cell 10 for various reasons. The defect in the battery cell 10 may include an internal short-circuit path caused by insertion of foreign substances, etc., or removal or damage of the components. In the case where the internal short-circuit path exists in the battery cell 10, a large leakage current may occur through the short-circuit path. A magnitude of the leakage current caused by the defect is larger than that of a general leakage current that exists in a normal battery cell.

A comparative example illustrates a voltage measurement method used to detect a defect in a battery cell 10. The apparatus 20 for detecting a defective battery cell according to the embodiment uses an electric current measurement method.

The voltage measurement method of the comparative example measures an initial voltage V0 of the battery cell 10, measures a voltage V1 dropped after storing the battery cell 10 for a long period of time, and then calculates an amount of a voltage drop V0–V1. The initial voltage V0 and the dropped voltage V1 may be measured with open circuit voltage. In a case where the amount of the voltage drop is greater than a reference amount, it may be determined that a defect exists inside the battery cell 10.

The voltage measurement method of the comparative example requires a long period of time from several days to tens of days or more for testing. In addition, the voltage measurement method of the comparative example requires a large space for storing a battery cell 10 for the long period of time.

The electric current measurement method used in the embodiment measures a magnitude of charge current while supplying the charge current to a battery cell 10 so as to maintain the voltage of the battery cell 10 constant. An initial voltage V0 of the battery cell 10 is maintained during a test process. Accordingly, a voltage V2 of the battery cell 10 at the end of the test is the same as the initial voltage V0 of the battery cell 10. A magnitude of leakage current of a defective battery cell is larger than that of a normal battery cell. The charge current of the battery cell 10 capable of maintaining the constant voltage is equal to the leakage current thereof. That is, the magnitude of the charge current may substantially reflect the magnitude of the leakage current. Accordingly, it may be determined that when the charge current is large, the leakage current is also large. Accordingly, the electric current measurement method according to the embodiment may determine that a defect exists inside the battery cell 10 in a case where a measured charge current magnitude is greater than a reference magnitude. A magnitude of leakage current may be from several microamperes (µA) to several milliamperes (mA). The charge current may also have a larger value than the leakage current at a similar scale. The magnitude of leakage current may vary depending on the type, capacity, etc., of the battery cell 10.

Compared to the comparative example, the electric current measurement method according to the embodiment takes a relatively short period of time ranging from several hours to several days. In addition, since the electric current measurement method according to the embodiment requires the relatively short test time compared to the comparative example, a space for storing a battery cell 10 may be reduced.

Figures 3, 4:
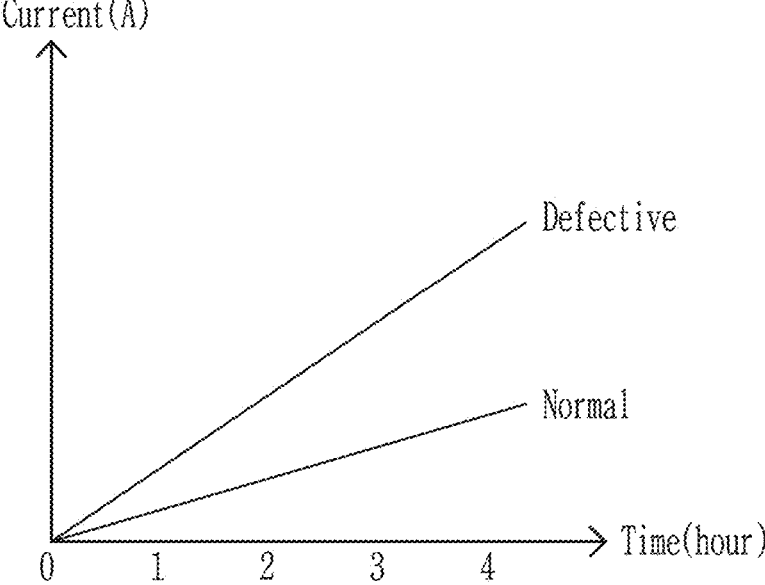
FIG. 3 shows an example of a defect detection standard of the apparatus for detecting a + defective battery cell based on an embodiment.
FIG. 4 shows an example of another defect detection standard of the apparatus for detecting a defective battery cell based on an embodiment.

FIG. 3 shows an example of a defect detection standard of the apparatus 20 for detecting a defective battery cell based on an embodiment.

The controller 23 according to the embodiment may determine that a defect exists in a battery cell 10 in a case where a current magnitude measured by the measurement part 21 is greater than a reference value. As shown in FIG. 3, the storage 24 may store a magnitude of charge current of a normal battery cell. The charge current of the normal battery cell is the charge current magnitude measured at a time when charge current is supplied to cause the battery cell 10 having no internal defect to maintain a constant voltage. The controller 23 may compare the charge current magnitude measured by the measurement part 21 with the charge current magnitude of the normal battery cell. The controller 23 may determine that a defect exists in the battery cell 10 in a case where the charge current magnitude measured by the measurement part 21 is greater than the charge current magnitude of the normal battery cell. The controller 23 may determine that a defect exists in the battery cell 10 in a case where the charge current magnitude measured by the measurement part 21 is greater than the charge current magnitude of the normal battery cell plus a predetermined reference value.

FIG. 4 shows an example of another defect detection standard of the apparatus 20 for detecting a defective battery cell based on an embodiment.

The controller 23 according to the embodiment may store current magnitudes measured by the measurement part over time, perform a comparison with an electric current graph of a normal battery cell, and determine that a defect exists in a battery cell in a case where a difference greater than or equal to a predetermined standard occurs. The charge current graph of the normal battery cell as shown in FIG. 4 may be stored in the storage 24. The graph illustrating the charge currents of the normal battery cell over time may be relatively gently sloping upward to the right. The controller 23 may compare a graph illustrating the charge currents measured by the measurement part 21 over time with the graph of the charge currents of the normal battery cell. The controller 23 may determine that a defect exists in a battery cell 10 in a case where a difference between the graph of the charge currents measured by the measurement part 21 and the graph of the charge currents of the normal battery cell is greater than the predetermined standard.

In the case of determining that a defect exists in a battery, the controller 23 may notify the presence of the defect in the battery through the display 25.

Tests using the apparatus 20 for detecting a defective battery cell according to the embodiment may be performed under specific test conditions. State Of Charge (SOC) indicates the charging status of the battery cells (10) as a percentage from 0 to 100%. The test conditions relate to a SOC of a battery cell 10, a temperature of a test environment, a rest period after charging the battery cell 10, and a series resistance between the battery cell 10 and the measurement part 21. A test SOC of the battery cell 10 may be between 20% and 40%. A test SOC of the battery cell 10 may be between 25% and 35%. A test SOC of the battery cell 10 may be 30%. A test temperature of the battery cell 10 may be between 20° C. and 30° C. A series resistance between the battery cell 10 and the measurement part 21 may be 1Ω or more. The battery cell 10 may be allowed to rest at the test temperature for a period of time ranging from 12 to 24 hours after being charged to a test SOC. The test conditions according to the embodiment are derived through comparative testing results of various types of normal battery cells and defective battery cells.

Table 1 below shows four tests designed to derive a test SOC having excellent defect screening ability for type A battery cells 10.

TABLE 1

| Division | Test 1 | Test 2 | Test 3 | Test 4 |
|---|---|---|---|---|
| Group 1 (2 normal and 4 defective battery cells) | SOC 10% | SOC 30% | SOC 58% | SOC 90% |
| Group 2 (2 normal and 4 defective battery cells) | SOC 30% | SOC 58% | SOC 90% | SOC 10% |

TABLE 1-continued

| Division | Test 1 | Test 2 | Test 3 | Test 4 |
|---|---|---|---|---|
| Group 3 (2 normal and 4 defective battery cells) | SOC 58% | SOC 90% | SOC 10% | SOC 30% |
| Group 4 (2 normal and 4 defective battery cells) | SOC 90% | SOC 10% | SOC 30% | SOC 58% |

Figure 5A:
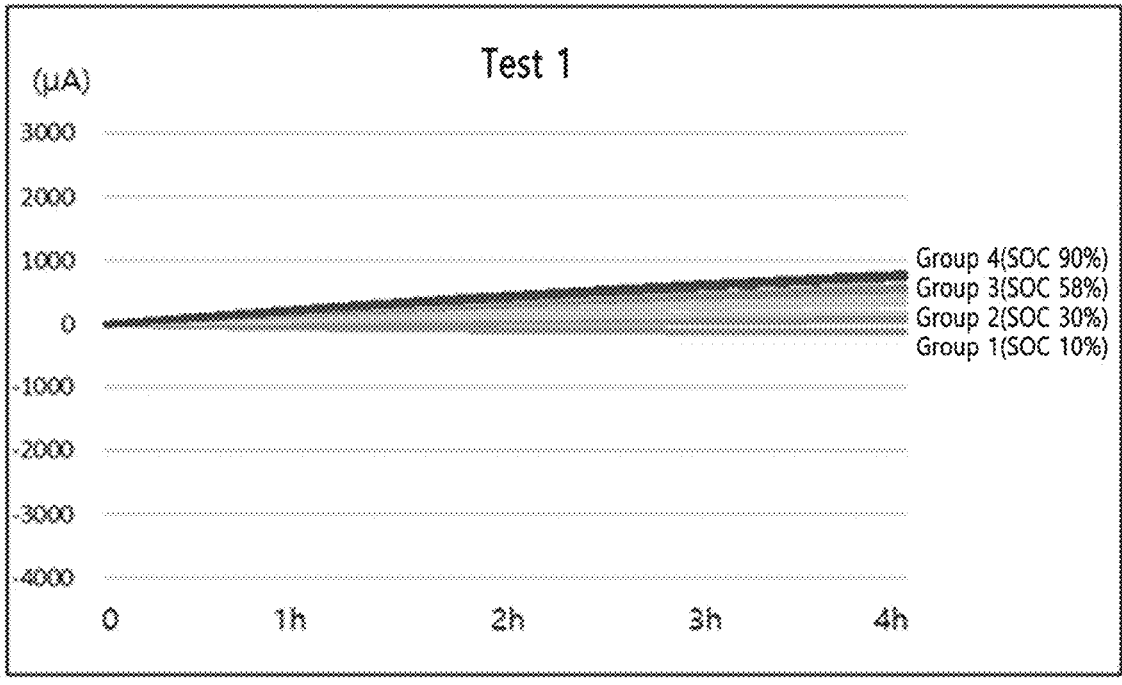
FIGS. 5A, 5B, 5C, and 5D are graphs illustrating leakage currents measured in respective Test 1, Test 2, Test 3, and Test 4.
Figure 5B:
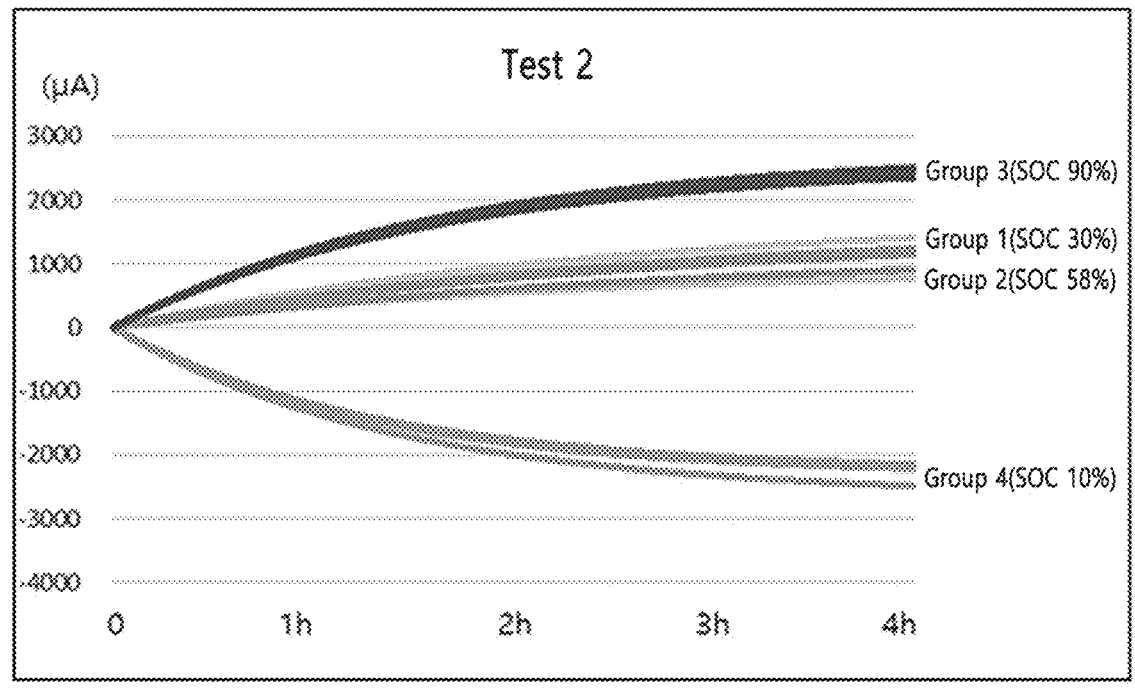
Figure 5C:
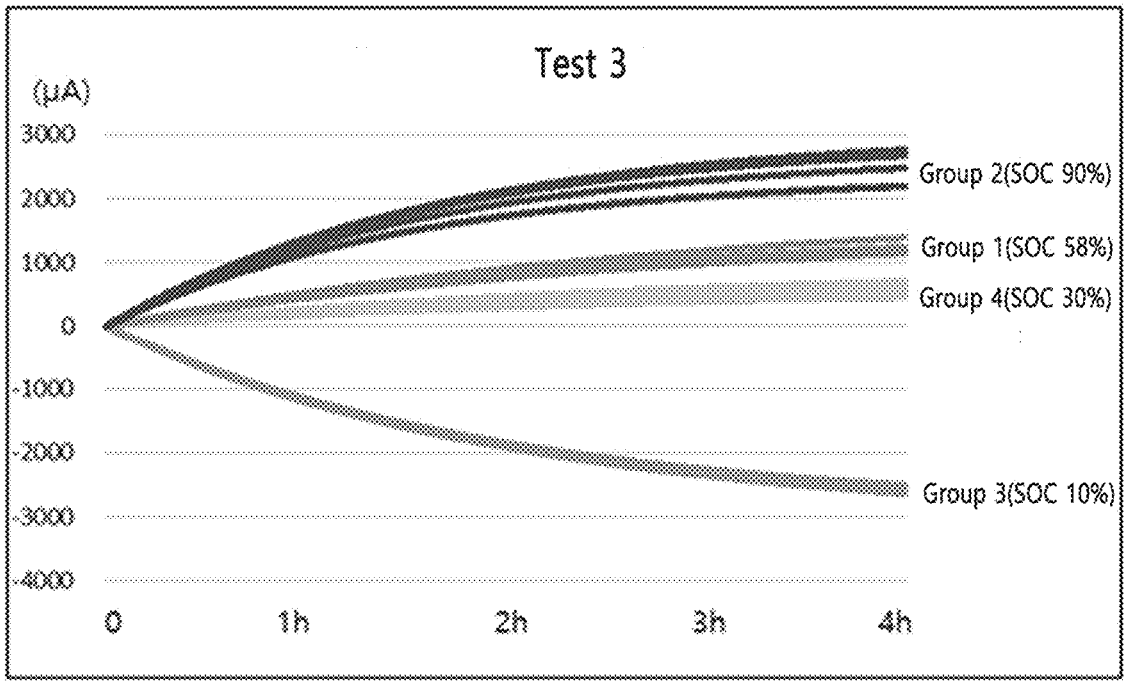
Figure 5D:
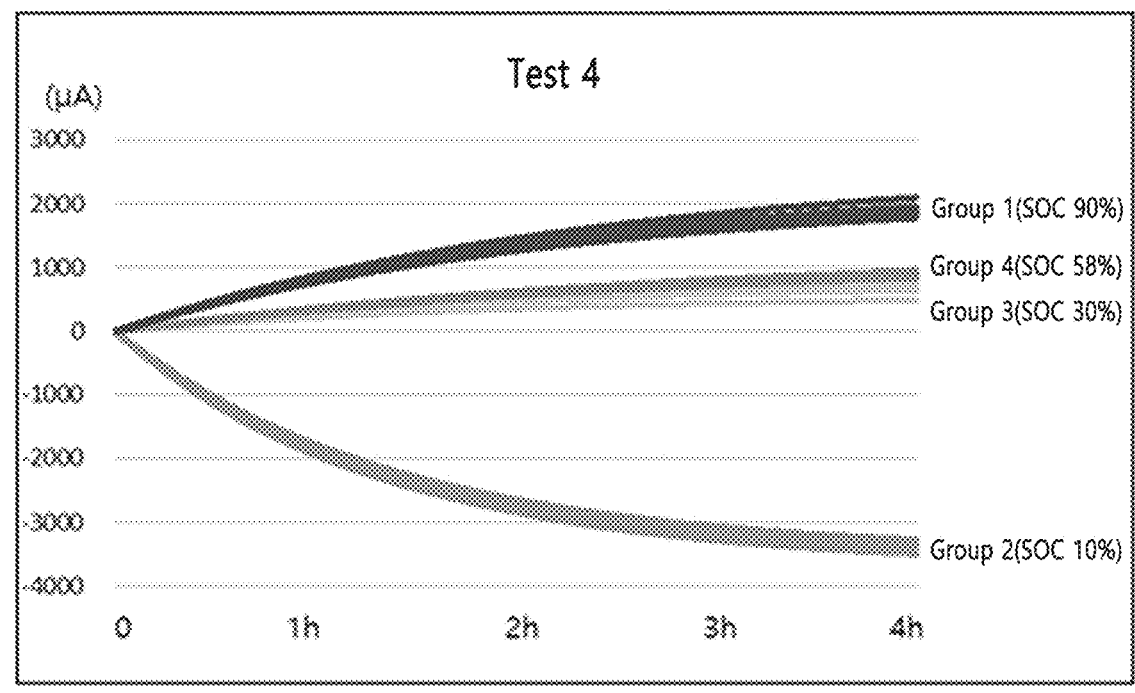
Figure 5E:
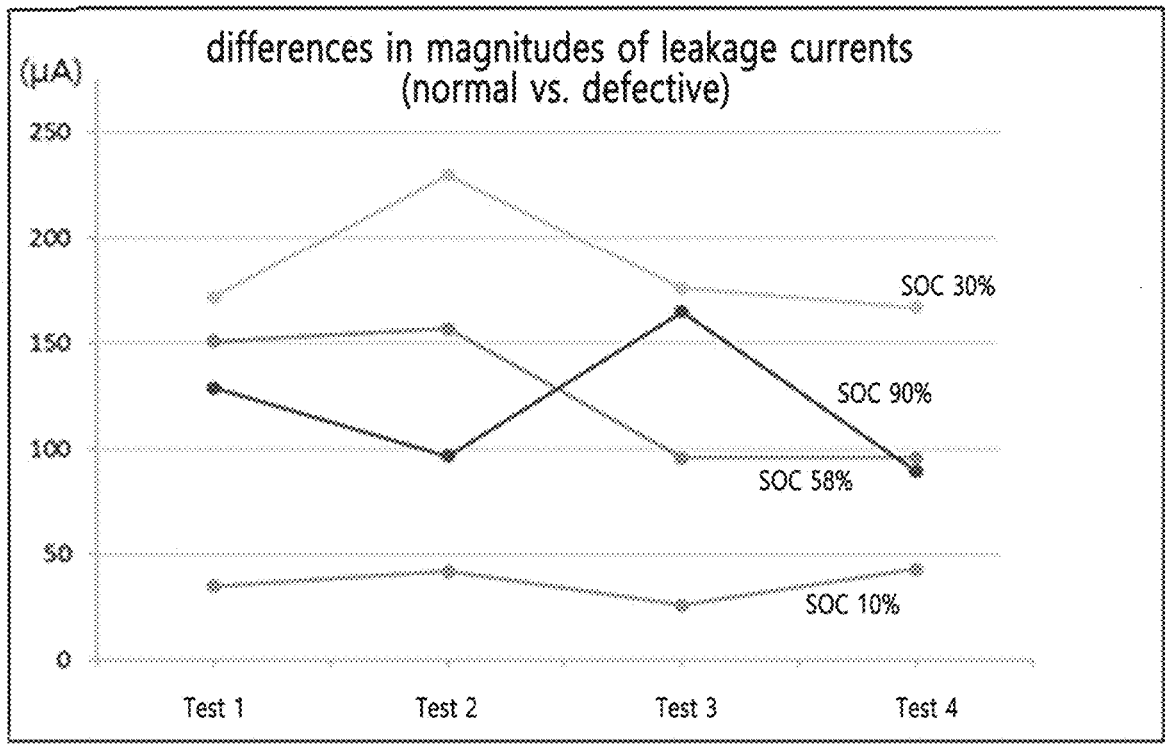
FIG. 5E is a graph illustrating differences in leakage current magnitudes between normal battery cells and defective battery cells for each SOC.

Four tests were performed by changing SOC conditions for each of four groups. Each group includes two normal battery cells and four defective battery cells. The tests were performed for each group in a state of being charged to a SOC different for each test. The tests were performed in the following order: Test 1, Test 2, Test 3, and Test 4. In a state where charging to SOCs predetermined for each group is performed, the tests are performed in a method where leakage currents are measured by connecting the battery cells to an apparatus for detecting the leakage currents. When Test 1 was completed, the battery cells 10 in a group were charged to SOCs corresponding to Test 2, and then Test 2 was performed. In the embodiment, charge currents are measured under conditions where voltage is kept constant, so the charge currents are substantially the same as the leakage currents. Accordingly, the SOC conditions that may accurately discriminate a difference between the leakage currents of the normal battery cells and the leakage currents of the defective battery cells may also be equally applied to the embodiment. FIGS. 5A, 5B, 5C, and 5D are graphs illustrating the leakage currents measured in Test 1, Test 2, Test 3, and Test 4. FIG. 5E is a graph illustrating differences in leakage current magnitudes between the normal battery cells and the defective battery cells for each SOC. FIGS. 5A to 5E are referred together.

On the whole, as for leakage current measurement values for each SOC, SOC 90% is the largest, SOC 58% is the next largest, SOC 30% is the next largest, and SOC 10% is the smallest. In FIGS. 5B, 5C, and 5D, graphs of SOC 10% appear to slope downward to the right, which means that the SOC of the battery cells 10 is low, thereby causing a problem that leakage currents are not measured properly. Accordingly, SOC 10% is not suitable as a test SOC. At SOC 90%, deviation of the leakage currents measured for each test is relatively large and uniformity of the leakage currents is low. Accordingly, SOC 90% is not suitable as a test SOC. Referring to FIG. 5E, differences in leakage currents between normal battery cells and defective battery cells are greater at SOC 30% than SOC 58% in all tests. The differences in leakage currents may be obtained by subtracting the leakage currents of the normal battery cells from the leakage currents of the defective battery cells. Accordingly, SOC 30% with large differences in the leakage currents between the normal and defective battery cells is suitable as a test SOC. The larger the differences in the leakage currents between the normal battery cells and defective battery cells, the better distinguishing between the normal battery cells and defective battery cells.

FIGS. 6A, 6B, 6C, and 6D are graphs illustrating leakage currents measured by respective tests at SOC 10%, 30%, 58%, and 90%. FIG. 6E is a graph illustrating differences in leakage current magnitudes between normal battery cells and defective battery cells for each test. FIGS. 6A to 6E are referred together.

Figure 6A:
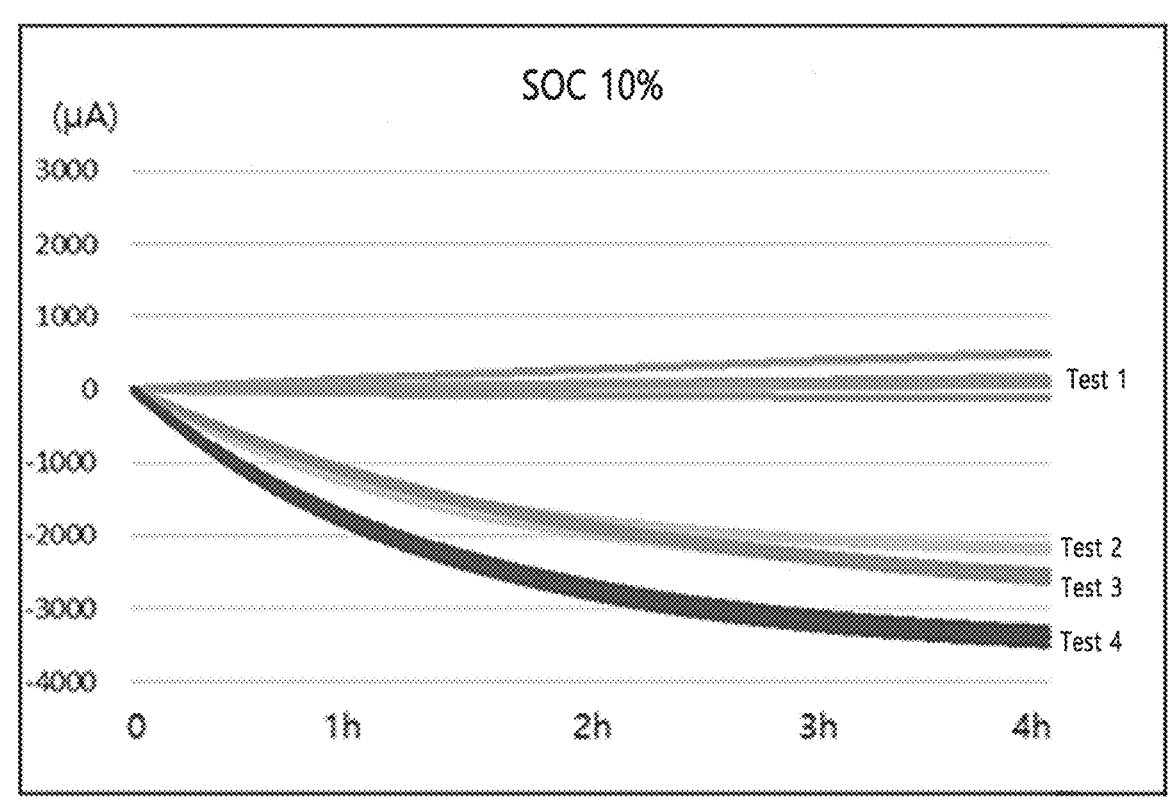
FIGS. 6A, 6B, 6C, and 6D are graphs illustrating leakage currents measured by respective tests at SOC 10%, 30%, 58%, and 90%.
Figure 6B:
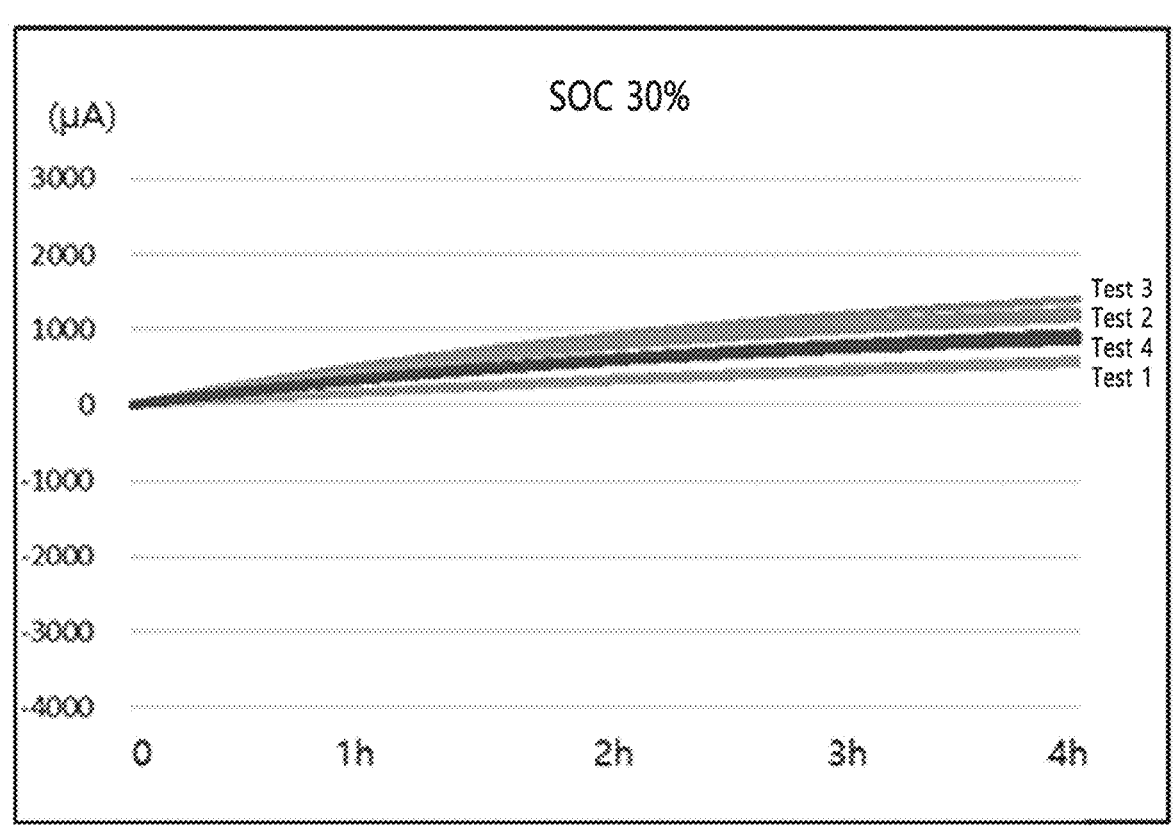
Figure 6C:
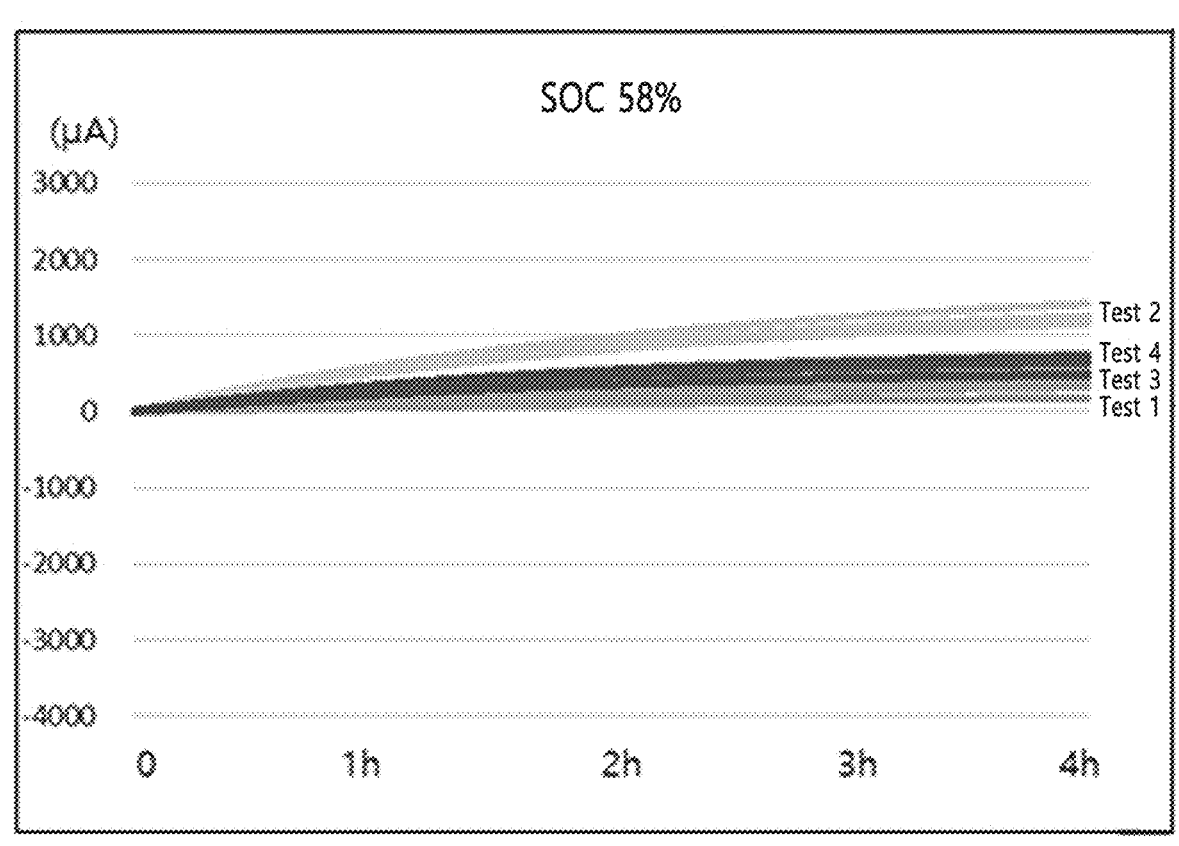
Figure 6D:
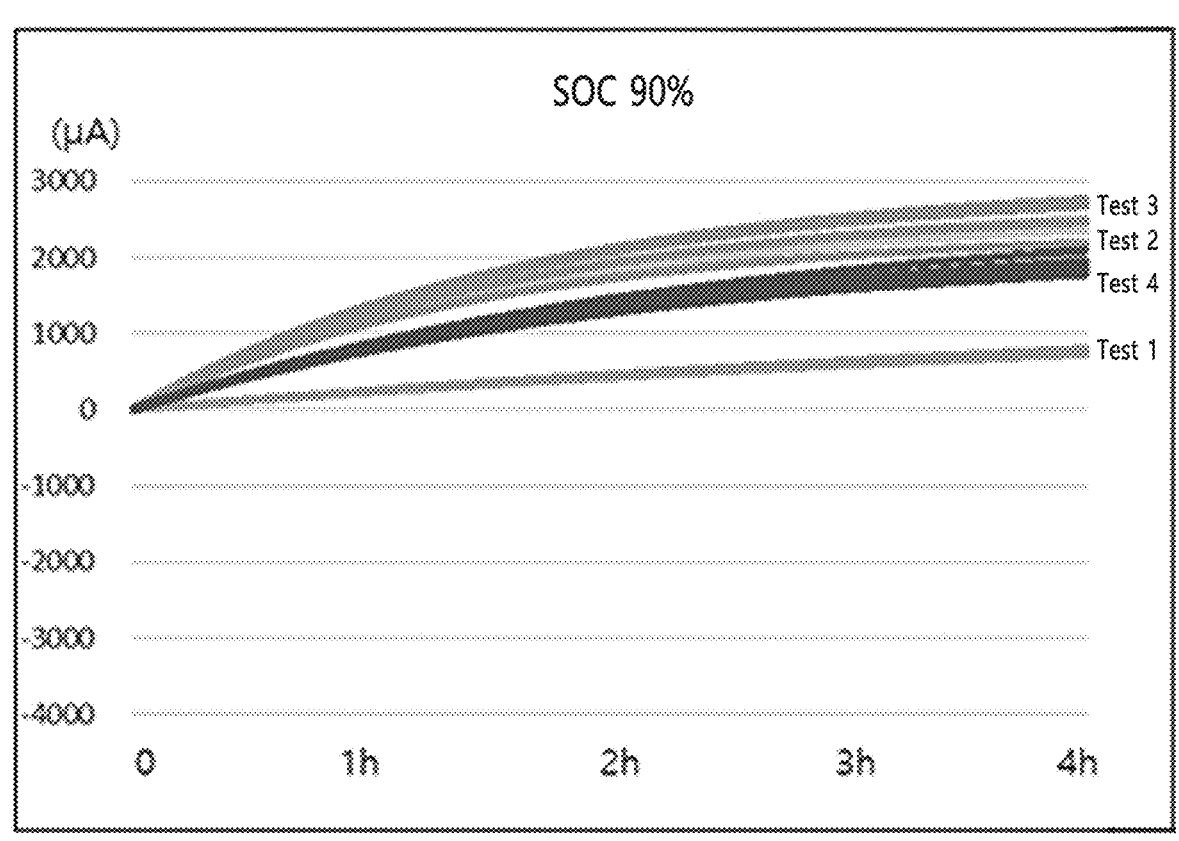
Figure 6E:
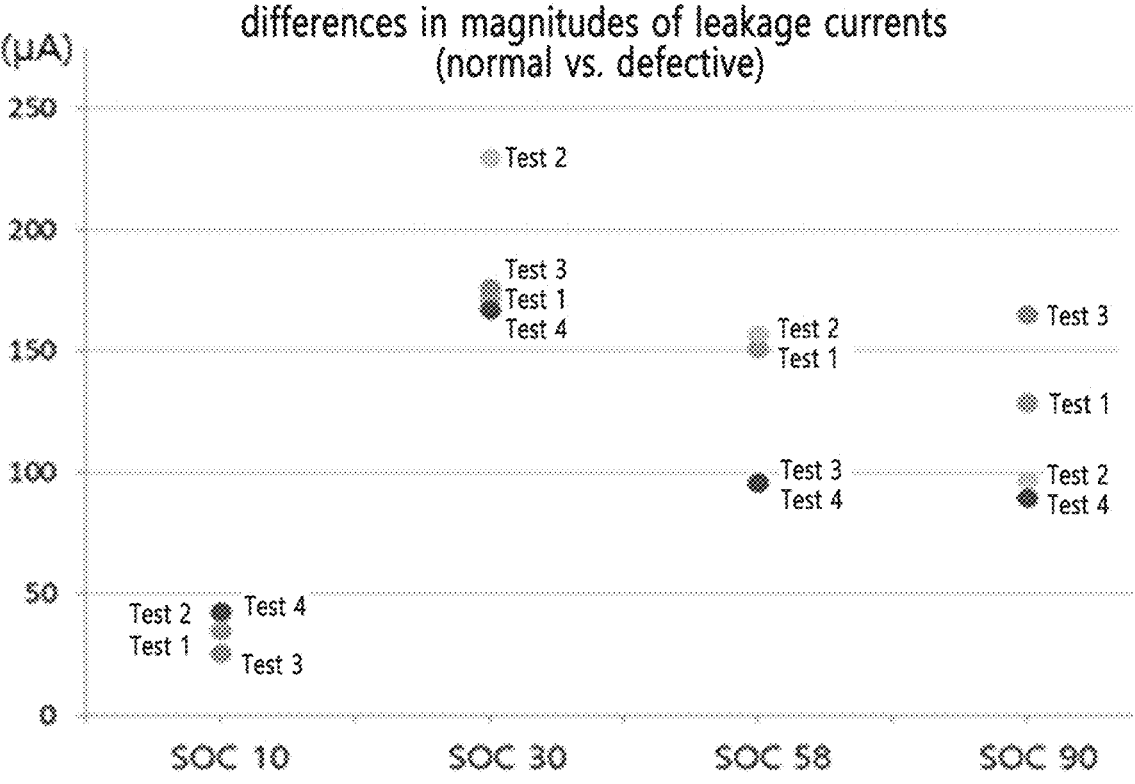
FIG. 6E is a graph illustrating differences in leakage current magnitudes between normal battery cells and defective battery cells for each test.

In FIG. 6A, it may be confirmed that deviation of leakage currents for each test at SOC 10% is very large. Accordingly, SOC 10% is not suitable as a test SOC. In FIG. 6D, it may be confirmed that deviation of leakage currents appear relatively large for each test at SOC 90%. Accordingly, SOC 90% is not suitable as a test SOC. When FIGS. 6B and 6C are compared with each other, it may be confirmed that deviation of leakage currents is small and constant at SOC 30%. Referring to FIG. 6E, differences in leakage currents between the normal battery cells and defective battery cells are the largest at SOC 30%. Accordingly, SOC 30%, where the differences in the leakage currents between the normal battery cells and defective battery cells are large, is suitable as a test SOC.

As described with reference to Table 1, FIGS. 5A to 5E, and 6A to 6E, it is confirmed that the test conditions of the apparatus 20 for detecting a defective battery cell according to the embodiment are the most suitable when the SOC of the battery cells 10 is 30%. Hereinafter, all tests for deriving conditions of test temperature, test rest period, and series resistance were performed with the test SOC at 30%.

Figure 7A:
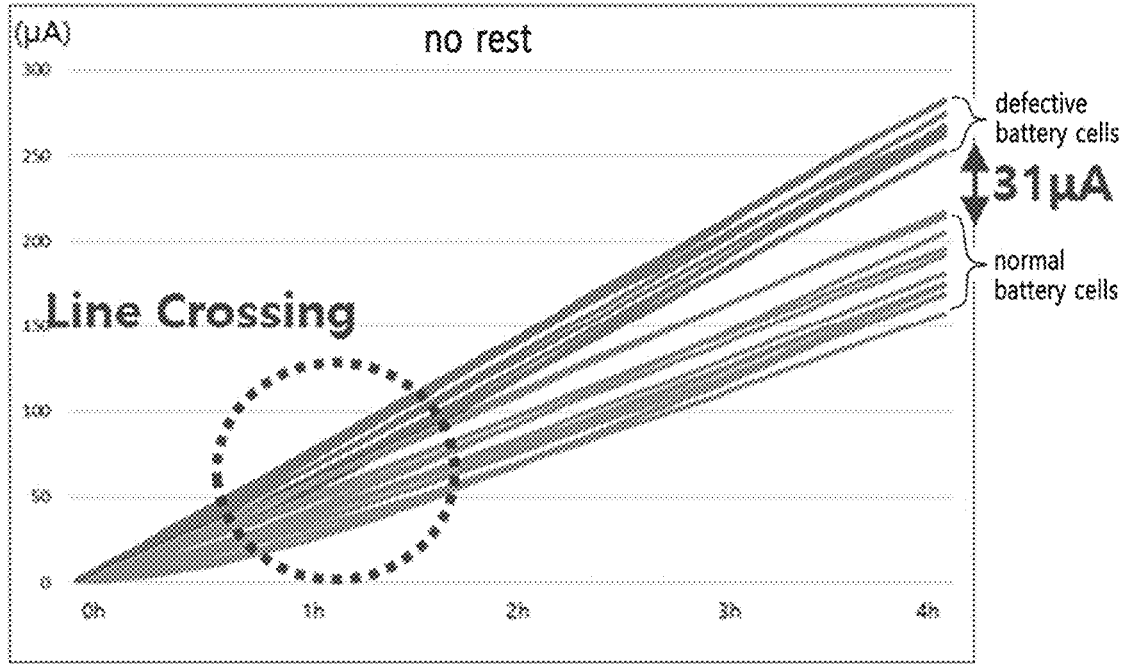
FIGS. 7A, 7B, and 7C are views illustrating leakage currents measured under different resting conditions after setting a SOC.
Figure 7B:
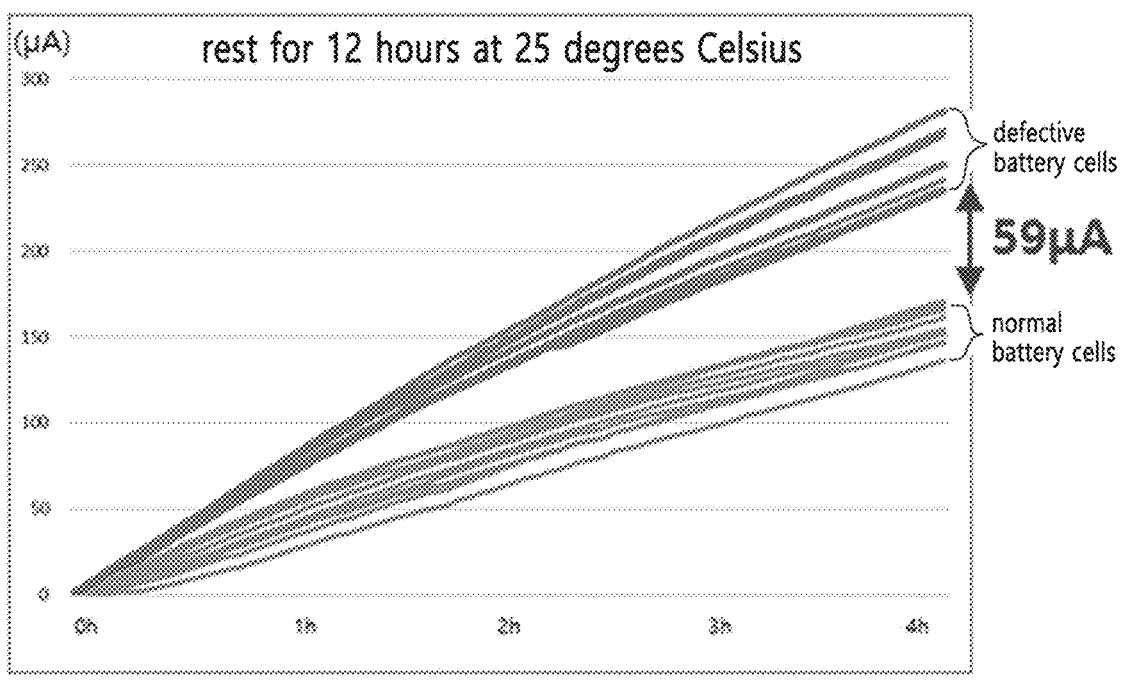
Figure 7C:
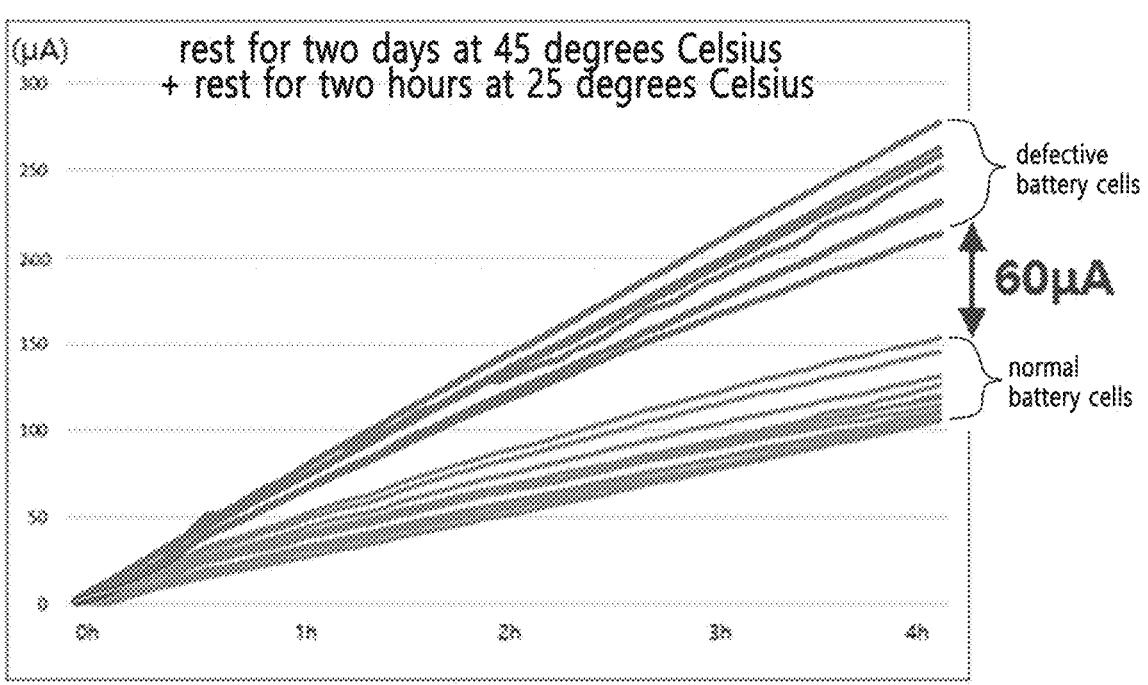

FIGS. 7A, 7B, and 7C are views illustrating leakage currents measured under different respective resting conditions after setting a SOC. FIGS. 7A to 7C are referred together.

In order to derive suitable test resting conditions, tests were performed to compare leakage currents according to three resting conditions for 12 normal battery cells and 12 defective battery cells in type A. "Rest" refers to charging and then stabilizing each battery cell 10 according to preset conditions.

FIG. 7A is a view illustrating results of performing tests immediately after setting a test SOC to 30% without providing rests. When battery cells 10 are connected to the apparatus for detecting a defective battery cell so as to measure leakage currents thereof immediately after charging the battery cells 10 to the test SOC, the battery cells 10 are not stabilized and show irregularities at the beginning of the measurement. In FIG. 7A, it may be confirmed that leakage currents of the normal battery cells and leakage currents of the defective battery cells are in line crossings in a section from a test start time to a time about one hour thereafter. In addition, after four hours, it may be confirmed that differences between the leakage currents of the normal battery cells and the leakage currents of the defective battery cells are relatively small. When the differences between the leakage currents of the normal battery cells and the leakage currents of the defective battery cells are relatively small, defect screening ability therefor is low.

FIG. 7B is a view illustrating results of tests performed after setting a test SOC to 30% and providing rests at 25° C. for 12 hours. When battery cells 10 are connected to the apparatus for detecting a defective battery cell so as to measure leakage currents thereof after charging the battery cells 10 to the test SOC and providing the rests at 25° C. for 12 hours, it may be confirmed that leakage current graphs of normal battery cells and leakage current graphs of the defective battery cells are relatively clearly separated from each other, and also density of the leakage current graphs of the normal battery cells is relatively high and density of the leakage current graphs of the defective battery cells is relatively high as well. In addition, it may be confirmed that differences between the leakage currents of the normal battery cells and the leakage currents of the defective battery cells are relatively large after four hours.

FIG. 7C is a view illustrating results of tests performed after setting a test SOC to 30% and providing rests at 45° C. for two days and rests at 25° C. for two hours. When battery cells are connected to the apparatus for detecting a defective battery cell so as to measure leakage currents thereof after charging the battery cells 10 to the test SOC and providing the rests at 45° C. for two days and rests at 25° C. for two hours, it may be confirmed that leakage current graphs of normal battery cells and leakage current graphs of defective battery cells are relatively clearly separated. However, compared to FIG. 7B, it may be confirmed that density of the leakage current graphs of the normal battery cells is relatively low and density of the leakage current graphs of the defective battery cells is relatively low as well. In addition, it may be confirmed that differences between the leakage currents of the normal battery cells and the leakage currents of the defective battery cells are similar to each other after four hours.

Reviewing the above test results, it may be confirmed that performing a rest after charging each battery to a test SOC is helpful in screening between normal and defective battery cells, distinguishing the graphs of the normal and defective battery cells is relatively clear, and determining test resting conditions to be conditions of a 12 hour rest at 25° C. with high density is appropriate. Hereinafter, tests for deriving a test temperature and series resistance were performed under the conditions that battery cells are charged to a test SOC and provided with respective rests at 25° C. for 12 hours.

Figure 8A:
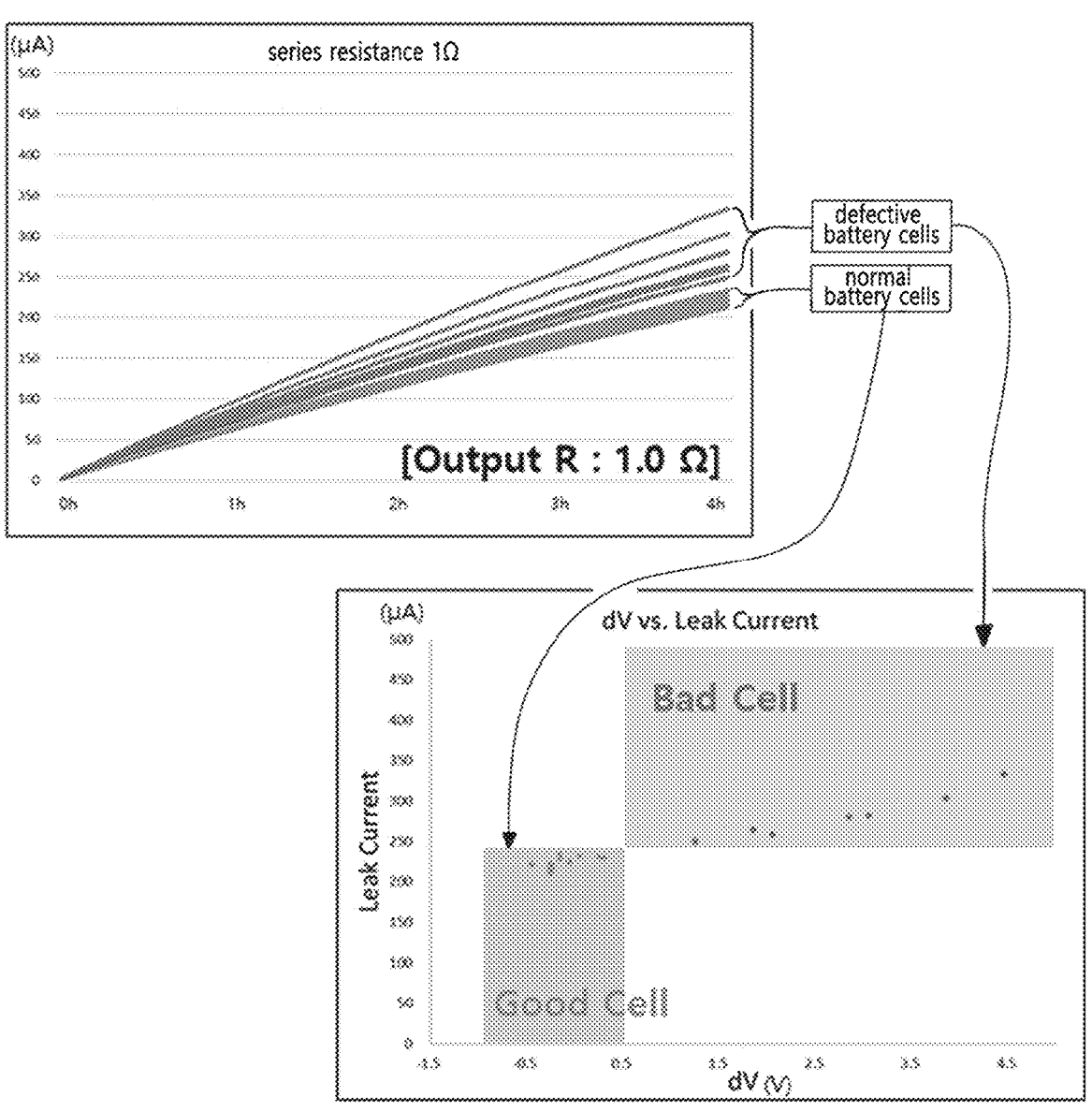
FIGS. 8A and 8B are graphs illustrating measurement of leakage currents by setting test resistances differently.
Figure 8B:
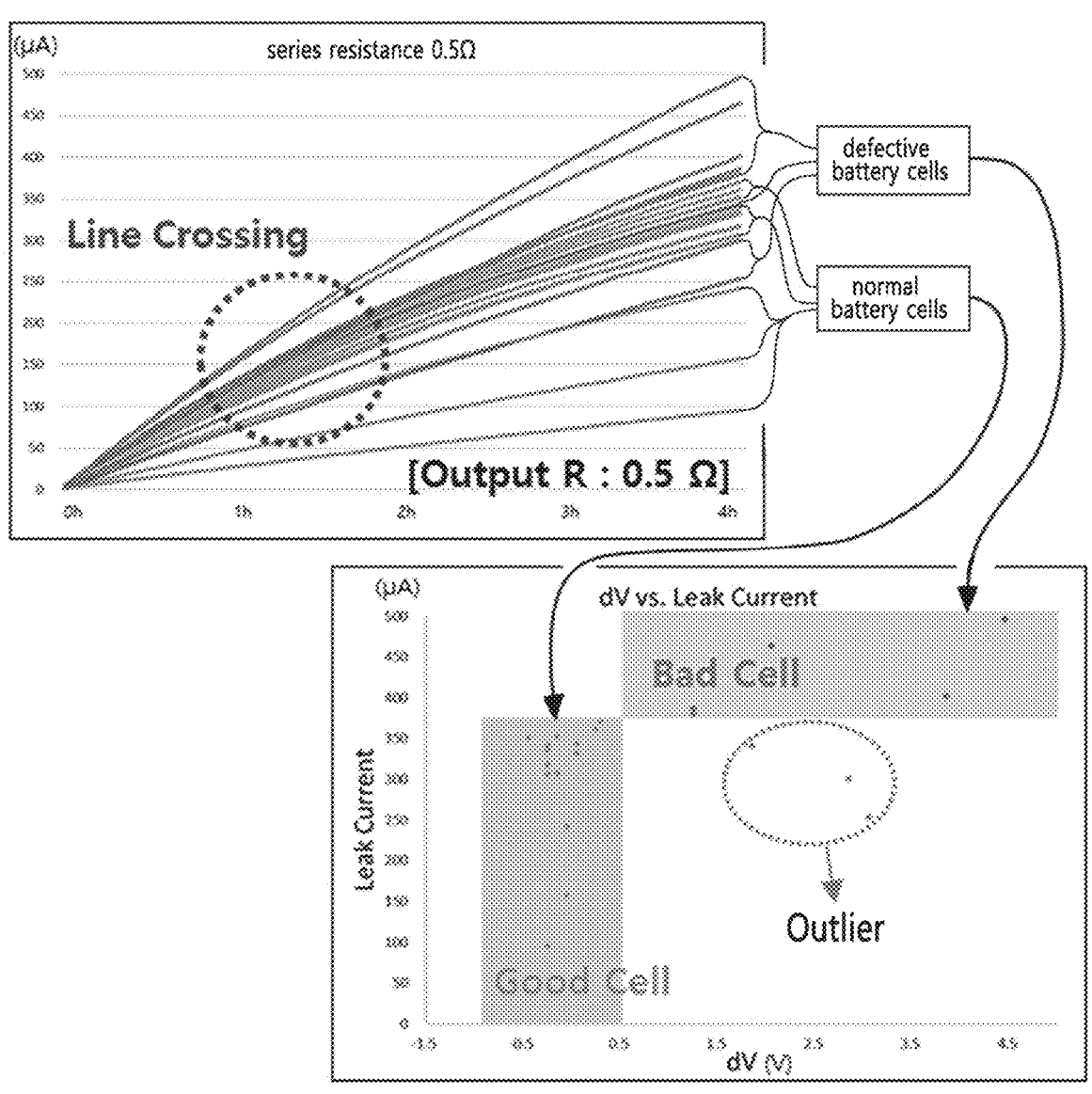

FIGS. 8A and 8B are graphs illustrating measuring leakage currents by setting test resistances differently. FIGS. 8A and 8B are referred together.

Since a leakage current of a battery cell 10 has a small magnitude, when a series resistance between a battery cell 10 and the measurement part 21 changes, accuracy of measurement may be affected. In the present specification, a series resistance between the battery cell 10 and the measurement part 21 is referred to as test resistance. In order to derive a suitable test resistance, leakage currents of normal and defective battery cells in type A were measured at test resistances of 1Ω and 0.5Ω.

FIG. 8A illustrates a graph showing leakage currents measured when a series resistance between the measurement part 21 and each battery cell 10 is 1Ω, and illustrates a scatter diagram showing the leakage currents and voltage drops at the same time. FIG. 8B illustrates a graph showing leakage currents measured when a series resistance between the measurement part 21 and each battery cell 10 is 0.5Ω, and illustrates a scatter diagram showing the leakage currents and voltage drops at the same time.

The leakage current graphs of normal battery cells and leakage current graphs of defective battery cells in FIG. 8A are denser than the leakage current graphs of normal battery cells and leakage current graphs of defective battery cells in FIG. 8B. In FIG. 8B, it may be confirmed that the leakage current graphs of the normal battery cells and the leakage current graphs of the defective battery cells cause a line crossing area, so the series resistance of 0.5Ω is not suitable as a test resistance.

In the scatter diagram of FIG. 8A, when respective leakage currents are large, the normal battery cells and defective battery cells appear in proportional relationships where voltage drops dV are large. Accordingly, a plurality of normal battery cells exist in a Good Cell area, and a plurality of defective battery cells exist in a Bad Cell area. However, in the scatter diagram of FIG. 8B, it is confirmed that there are unreasonable outliers in which their leakage currents are small and voltage drops dV are large. The outliers are present in positions outside the Good Cell area and Bad Cell area. Accordingly, it may be confirmed that the series resistance of 0.5Ω is not suitable as a test resistance.

Since it is confirmed that the measurement tends to be inaccurate when a test resistance is low, it is preferable to set the test resistance to at least 1Ω or more.

Figure 9A:
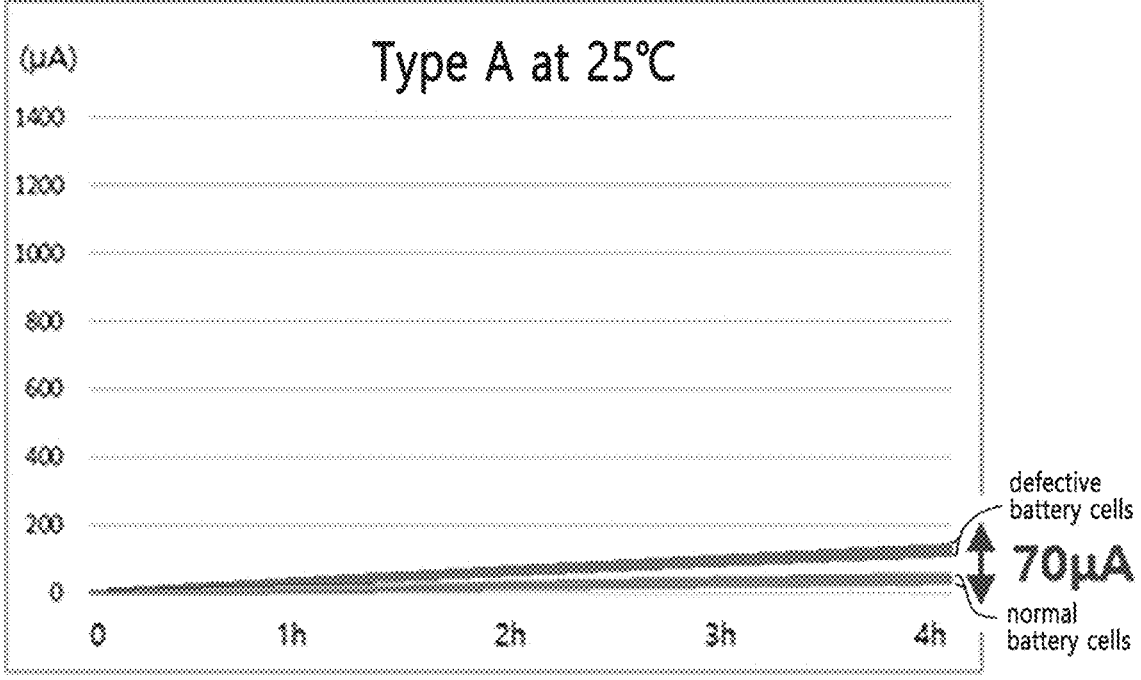
FIGS. 9A and 9B are views illustrating a comparison between leakage currents of type A battery cells and type B battery cells at 25° C.
Figure 9B:
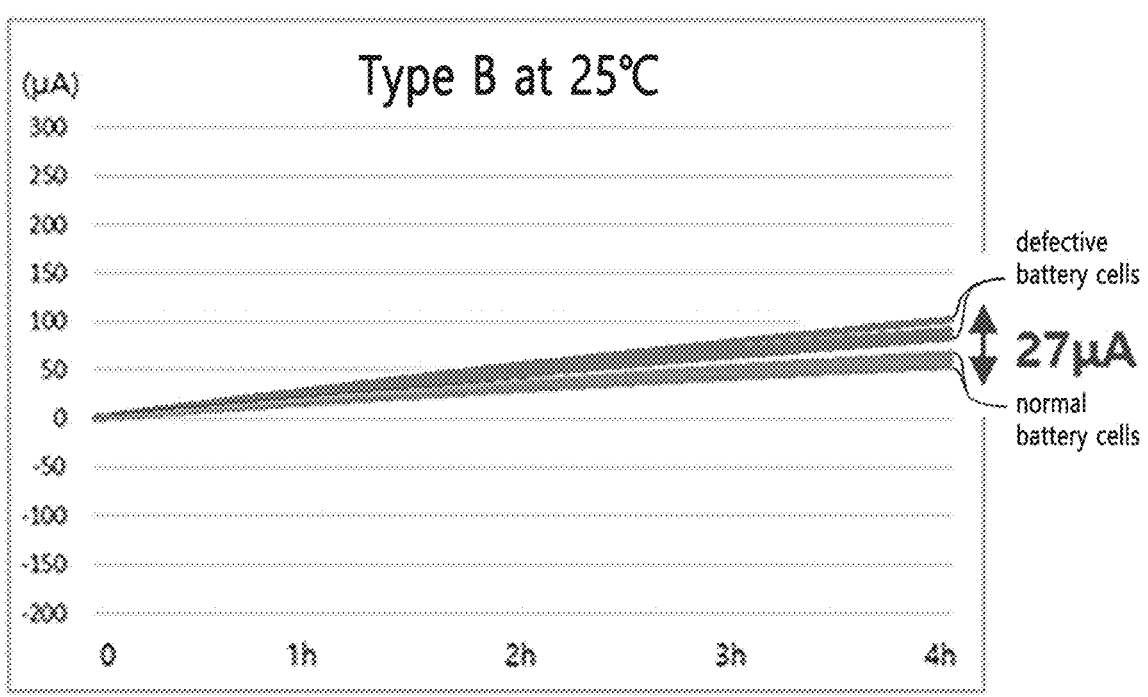
Figure 9C:
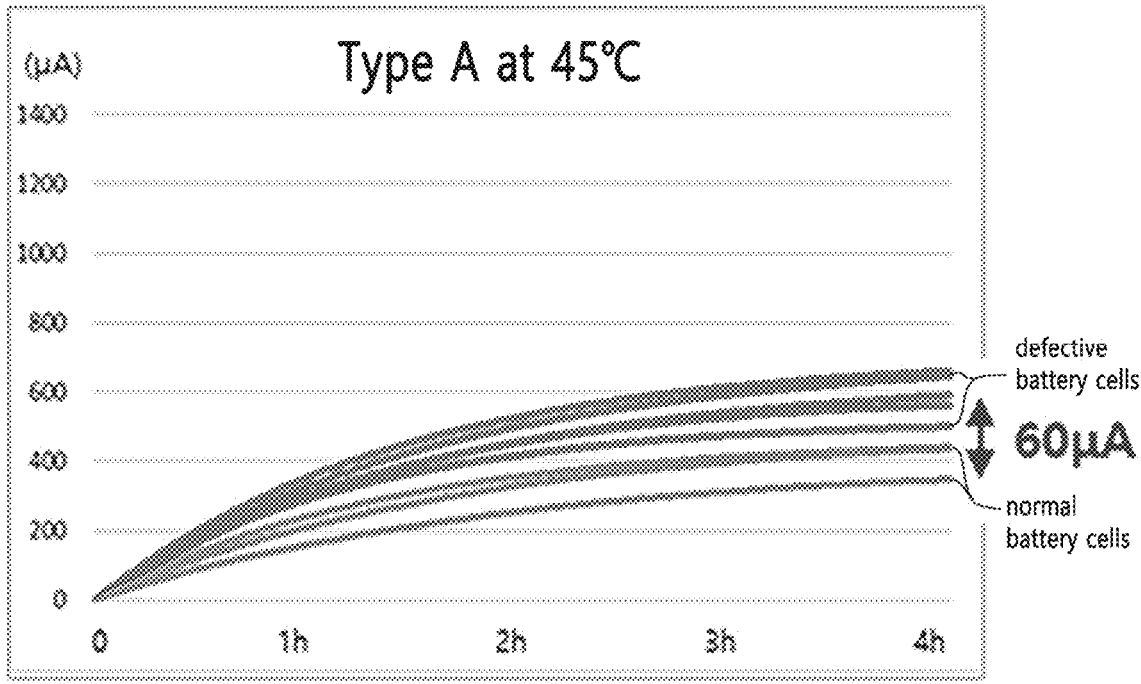
FIGS. 9C and 9D are views illustrating a comparison between leakage currents of type A battery cells and type B battery cells at 45° C.
Figure 9D:
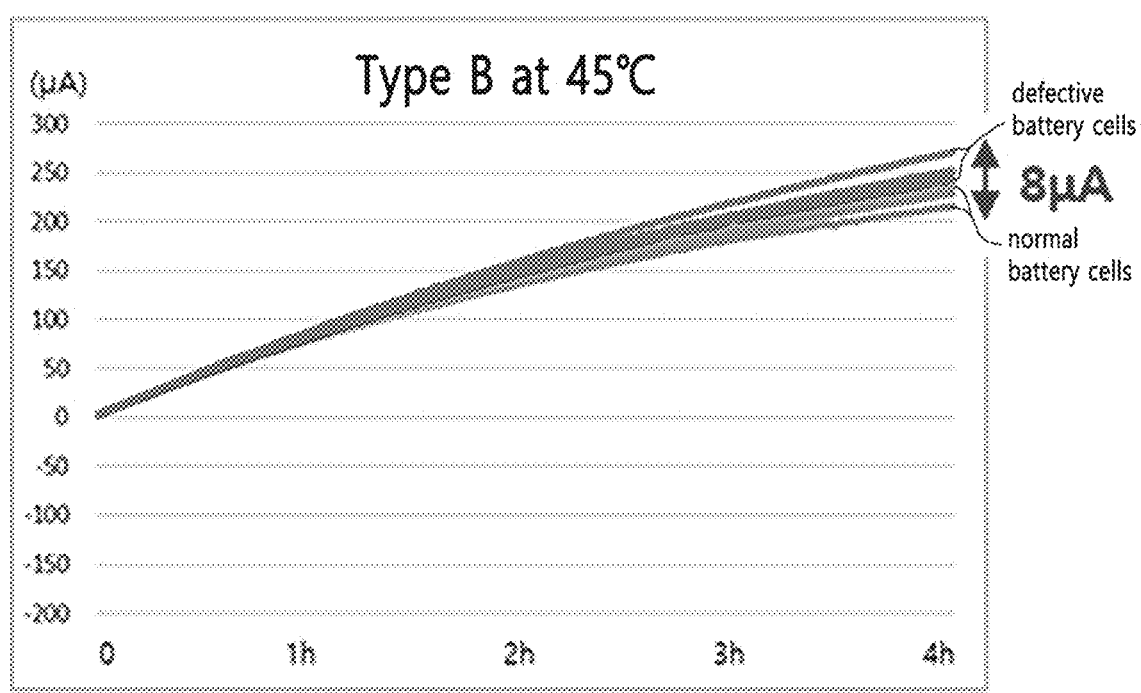
Figure 9E:
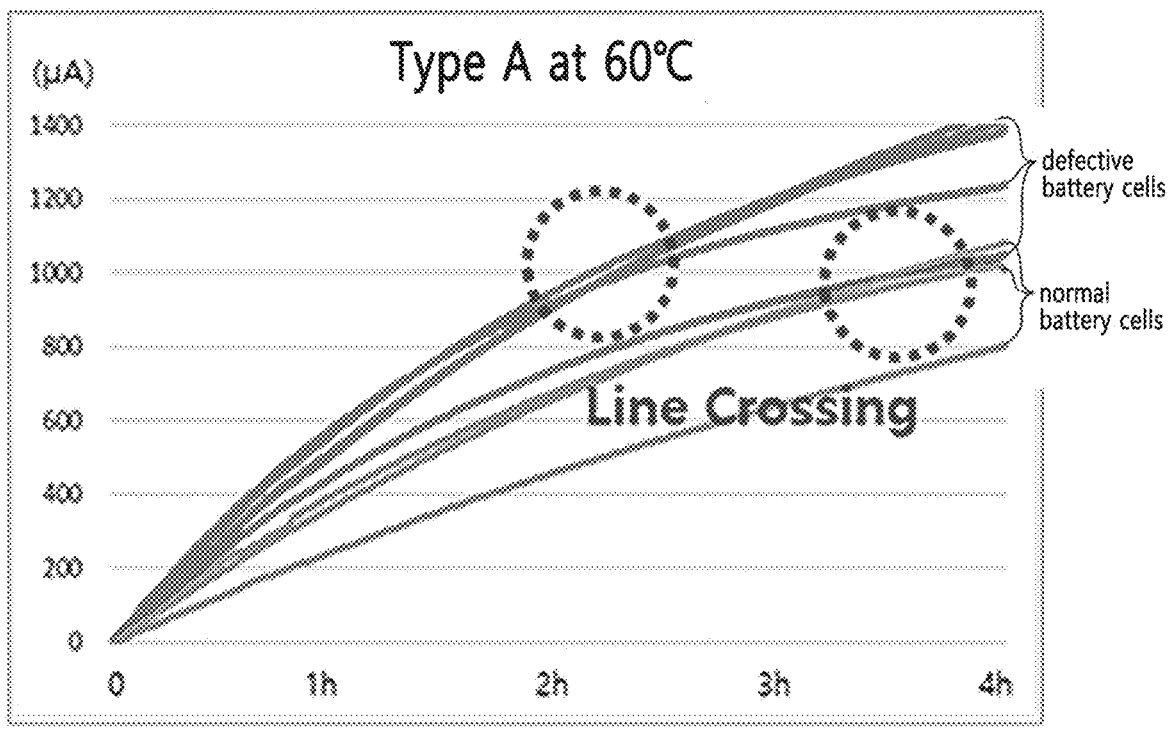
FIGS. 9E and 9F are views illustrating a comparison between leakage currents of type A battery cells and type B battery cells at 60° C.
Figure 9F:
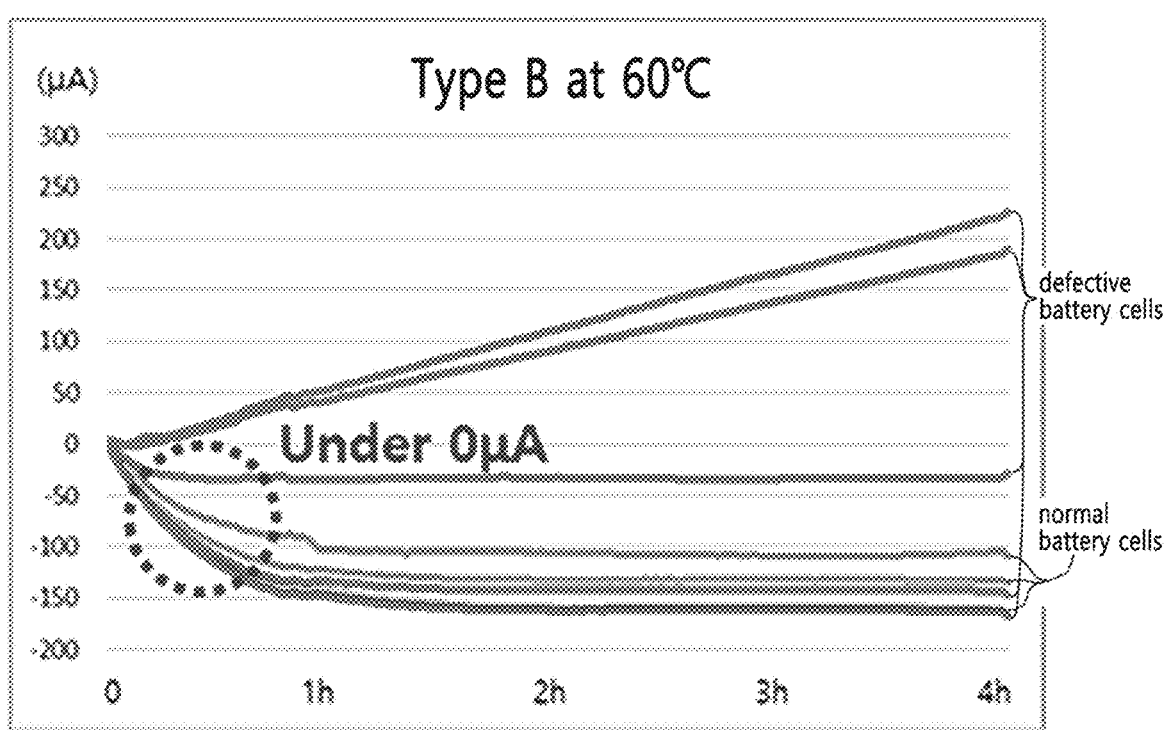

FIGS. 9A and 9B are views illustrating a comparison of leakage currents of type A battery cells 10 and type B battery cells 10 at 25° C. FIGS. 9C and 9D are also views illustrating a comparison of leakage currents of type A battery cells 10 and type B battery cells 10 at 45° C. FIGS. 9E and 9F are also views illustrating a comparison of leakage currents of type A battery cells 10 and type B battery cells 10 at 60° C. FIGS. 9A to 9F are referred together.

Since activity of each battery cell 10 varies depending on temperature, magnitudes of leakage currents may vary when a test temperature varies. In order to derive a test temperature with high screening ability for defective battery cells, leakage currents were measured at a room temperature 25° C. and high temperatures 45° C. and 60° C. In the tests, for four hours, leakage currents were measured with three normal battery cells and five defective battery cells in type A and three normal battery cells and five defective battery cells in type B.

Referring to FIG. 9A, it may be confirmed that leakage current graphs of the normal battery cells and defective battery cells in type A are distinguished from each other at 25° C. and a difference thereof is about 70 μA. Referring to FIG. 9B, it may be confirmed that leakage current graphs of the normal battery cells and defective battery cells in type B are distinguished from each other at 25° C. and a difference thereof is about 27 μA.

Referring to FIG. 9C, it may be confirmed that leakage current graphs of the normal battery cells and defective battery cells in type A are distinguished from each other at 45° C. and a difference thereof is about 60 μA. However, density of the leakage current graphs of the normal battery cells is relatively low. Density of the leakage current graphs of the defective battery cells is relatively low as well. Referring to FIG. 9D, it may be confirmed that leakage current graphs of the normal battery cells and defective battery cells in type B are distinguished from each other at 45° C. and a difference thereof is about 8 μA.

Referring to FIG. 9E, it may be difficult to distinguish between leakage current graphs of the normal battery cells and defective battery cells in type A because a line crossing area thereof is confirmed at 60° C. In addition, respective densities of the leakage current graphs of the normal battery cells and the leakage current graphs of the defective battery cells are relatively low.

Referring to FIG. 9F, it is confirmed that there is a case where some of the leakage current graphs of the normal battery cells and defective battery cells in type B have values less than 0 μA at 60° C. In addition, it is difficult to distinguish between the leakage current graphs of the defective battery cells and the leakage current graphs of the normal battery cells from each other. In addition, the higher the temperature, the more dispersed the graphs appear, thereby implying that more errors in measured values may occur in a high-temperature environment.

Accordingly, a temperature of 25° C. is suitable as a test temperature, wherein the leakage current graphs of the normal battery cells and the leakage current graphs of the defective battery cells are distinguished from each other, differences between the graphs are relatively large, and density of the graphs is high.

Figure 10A:
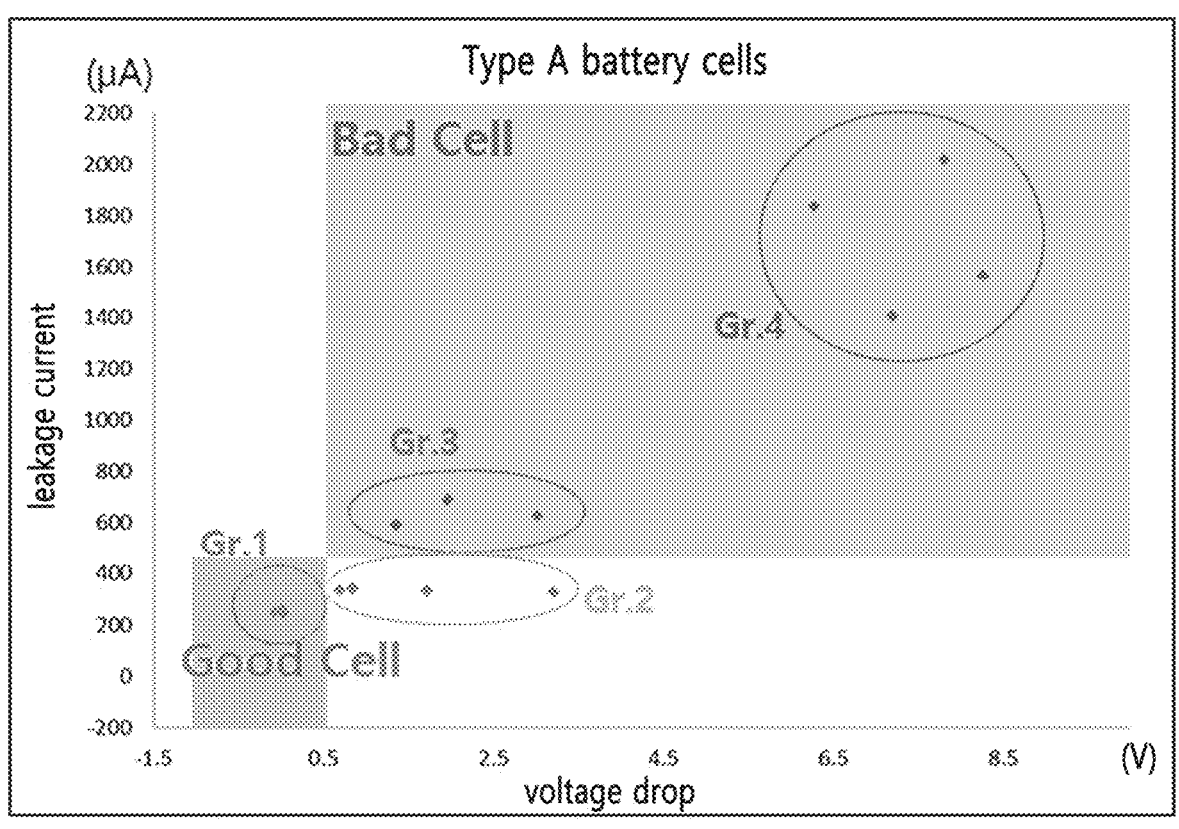
FIGS. 10A and 10B are views illustrating results of determining whether or not there are defects on the basis of open circuit voltages and leakage currents of a plurality of type A battery cells and a plurality of type B battery cells.
Figure 10B:
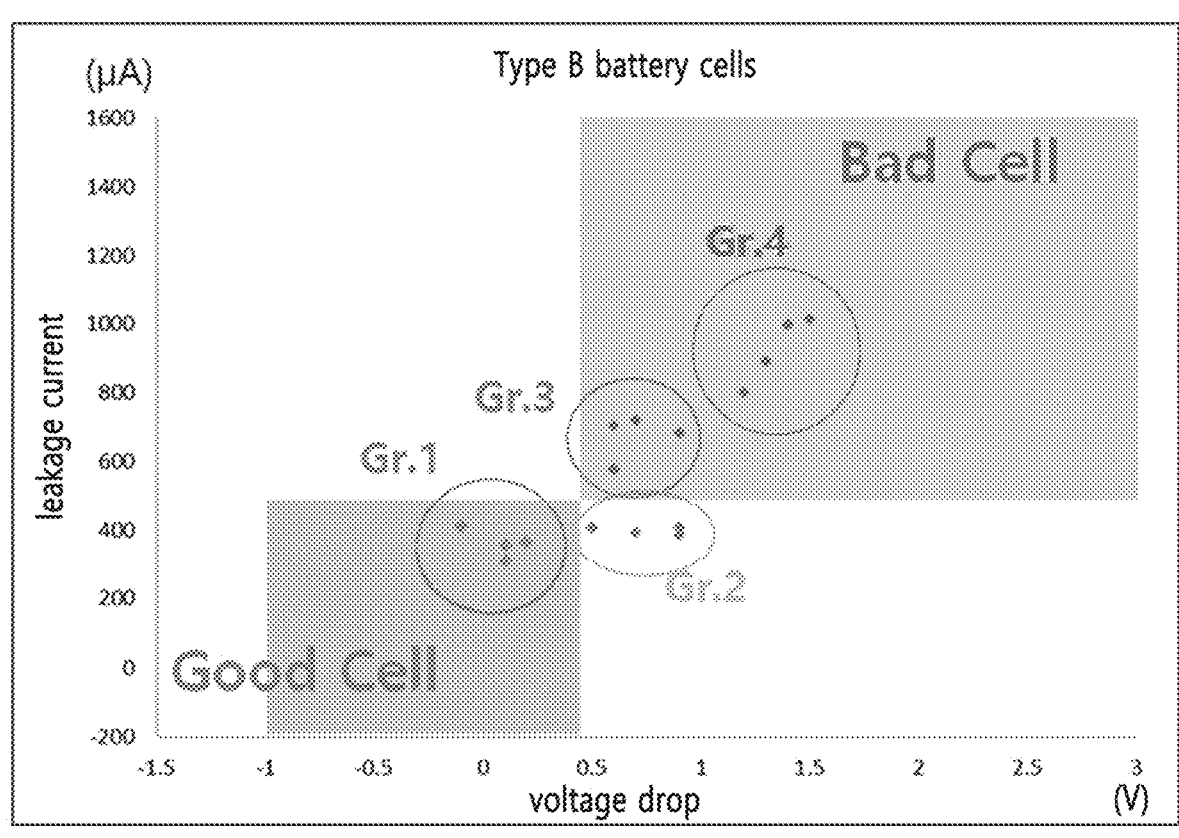

Table 2 and FIGS. 10A and 10B illustrate results of determining whether or not there is a defect on the basis of open circuit voltages and leakage currents of the plurality of type A battery cells 10 and the plurality of type B battery cells 10. Table 2 and FIGS. 10A and 10B are referred together. In FIGS. 10A and 10B, voltage drops represent differences in open circuit voltages.

TABLE 2

| Division | Open circuit voltage-based determination | Leakage current-based determination |
|---|---|---|
| Group 1 | Normal | Normal |
| Group 2 | Defective | Normal |
| Group 3 | Defective | Normal or defective |
| Group 4 | Defective | Defective |

Battery cells 10 that may be determined as normal (i.e., in a good cell area) due to their small open circuit voltages and small leakage currents may be designated as Group 1 Gr.1. Battery cells having relatively high open circuit voltages and low leakage currents may be designated as Group 2 Gr.2. Battery cells 10 having relatively large open circuit voltages and relatively large leakage currents may be designated as Group 3 Gr.3. Battery cells 10 that may be determined as defective (i.e., in a Bad Cell area) due to their high open circuit voltages and large leakage currents may be designated as Group 4 Gr.4. When determination is performed on the basis of the open circuit voltages, it may be classified such that Group 1 Gr.1 is normal, and Group 2 Gr.2, Group 3 Gr.3, and Group 4 Gr.4 are defective. When determination is performed on the basis of the leakage currents, it may be classified such that Group 1 Gr.1 and Group 2 Gr.2 are normal, and Group 3 Gr.3 and Group 4 Gr.4 are defective. Since differences in leakage currents between Group 3 Gr.3 and Group 2 Gr.2 are not large, there may be battery cells 10 that are determined to be normal due to a measurement environment change, etc. In both of the determination based on the open circuit voltages and the determination based on the leakage currents, Group 1 Gr.1 is determined as normal and Group 4 Gr.4 is determined as defective. Group 2 Gr.2 and Group 3 Gr.3 may be determined as defective in the determination based on the open circuit voltages, but may be determined as normal in the determination based on the leakage currents. Accordingly, it is required to verify reliability of the determination based on the leakage currents.

Figure 11A:
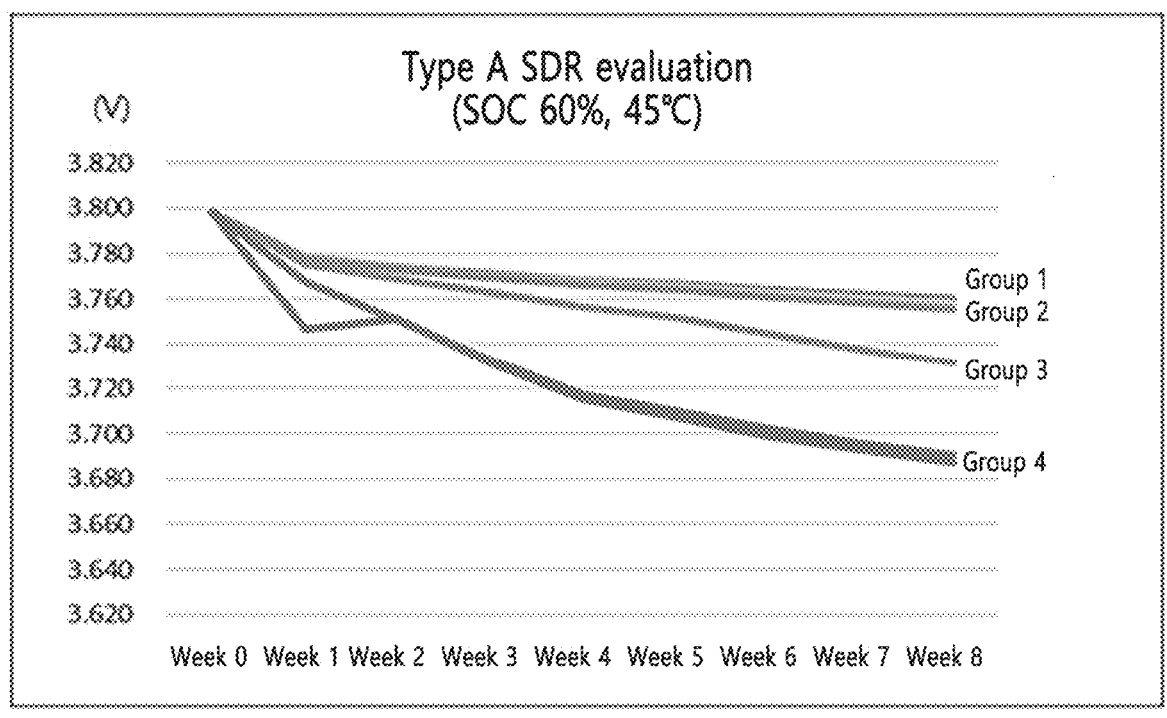
FIGS. 11A and 11B are views illustrating results of performing SDR evaluation on type A battery cells and type B battery cells.
Figure 11B:
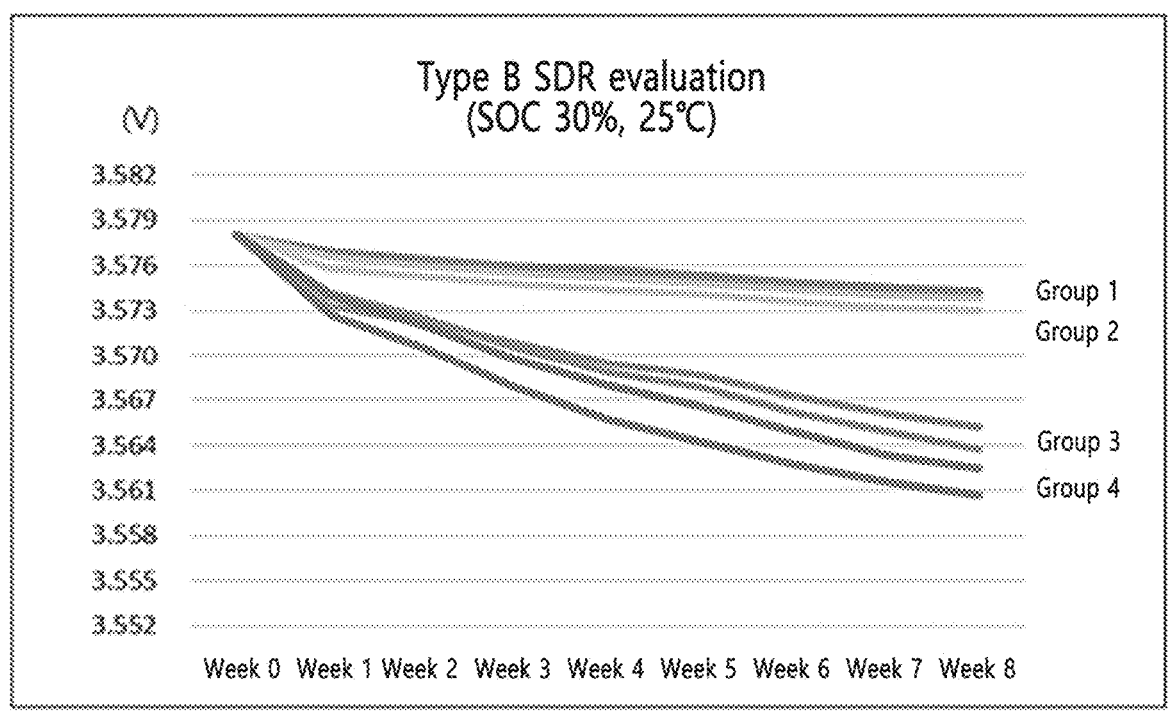
Figure 11C:
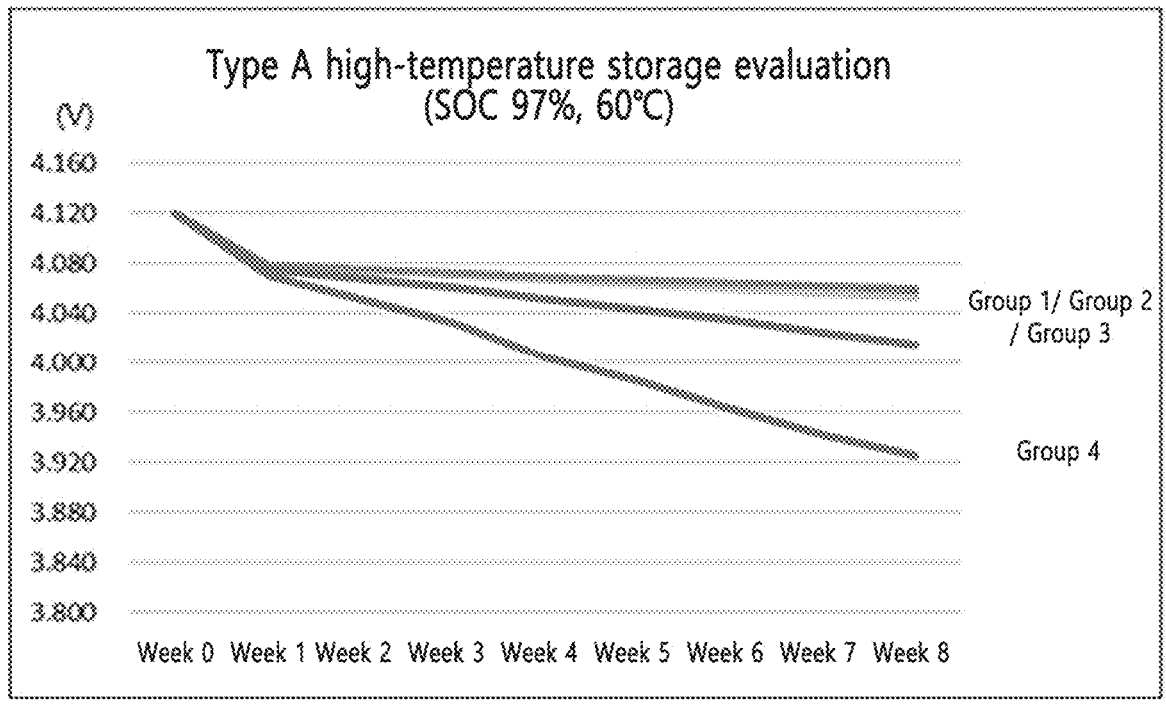
FIGS. 11C and 11D are views illustrating results of performing high-temperature storage evaluation on type A battery cells and type B battery cells.
Figure 11D:
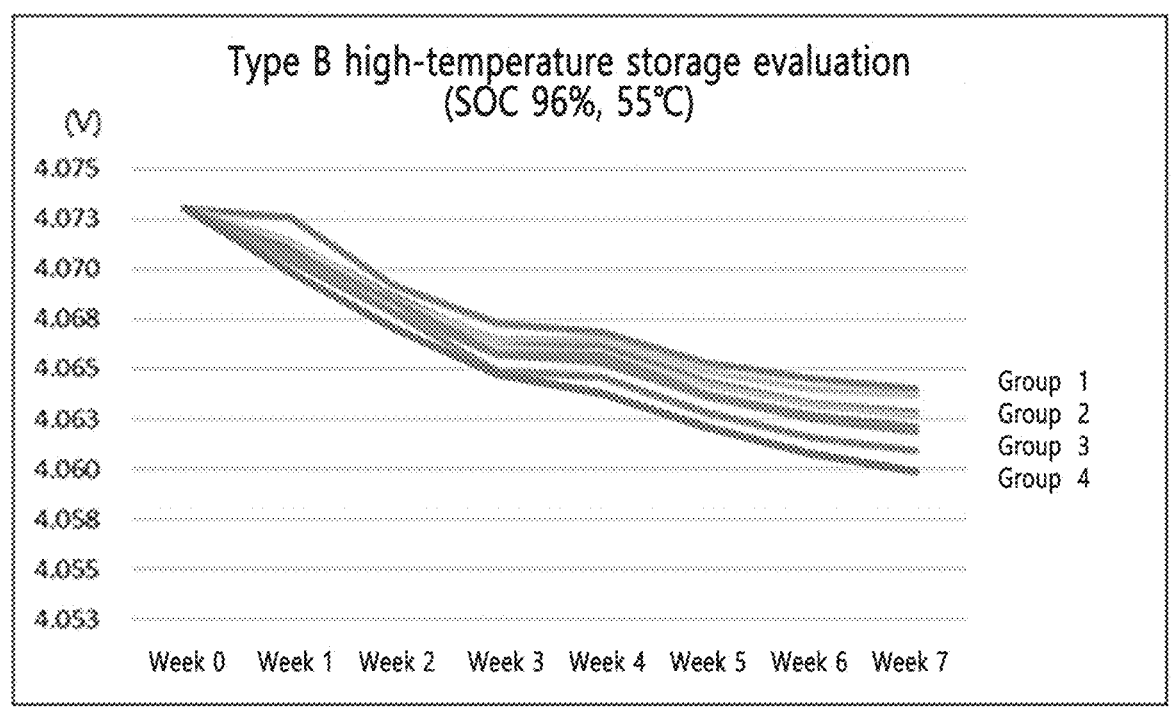

FIGS. 11A and 11B illustrate results of SDR(Self Discharge Rest) evaluation on type A battery cells 10 and type B battery cells 10. FIGS. 11C and 11D illustrate results of high-temperature storage evaluation on type A battery cells 10 and type B battery cells 10. Table 2, and FIGS. 10A, 10B, and 11A to 11D are referred together.

In FIGS. 10A and 10B, the battery cells 10 classified into Group 1, Group 2, Group 3, and Group 4 are evaluated by using the methods of high-temperature storage evaluation and SDR evaluation. The reliability of the leakage current-based evaluation may be verified by comparing results of performing the high-temperature storage evaluation and SDR evaluation with results of performing the leakage current-based evaluation or open circuit voltage-based evaluation.

In the open circuit voltage-based evaluation, Group 2 was evaluated as defective because the amounts of voltage drops were greater than those of Group 1. However, referring to the SDR evaluation results (in FIGS. 11A and 11B), it may be confirmed that the graphs of Group 1 and Group 2 show similar tendencies and small differences. Referring to the results of the high-temperature storage evaluation (in FIGS. 11C and 11D), it may be confirmed that the graphs of Group 1 and Group 2 have similar tendencies and small differences. Accordingly, it is appropriate to determine Group 2 as normal battery cells. Since the results of the leakage current-based evaluation show that Group 2 is normal, it may be determined that the reliability of the leakage current-based evaluation is higher than that of the open circuit voltage-based evaluation.

In the open circuit voltage-based evaluation, Group 3 was evaluated to have the same voltage drops as Group 2. However, in the leakage current-based evaluation, Group 3 has higher leakage currents than Group 2, so it is more likely to be determined as defective. Referring to the results of the SDR evaluation (in FIGS. 11A and 11B), it may be confirmed that the amounts of voltage drops of Group 3 are greater than the amounts of voltage drops of Group 2 in both type A and type B battery cells 10, thereby showing the same tendency as the leakage current-based evaluation.

In summary, it may be confirmed that the method of leakage current-based evaluation shows a tendency of producing results similar to those of the method of SDR evaluation in both of the type A battery cells 10 and the type B battery cells 10. It may be confirmed that the reliability of the leakage current-based evaluation is higher than that of the open circuit voltage-based evaluation.

As a result of reviewing the test conditions described above, the apparatus 20 for detecting a defective battery cell according to the embodiment may measure magnitudes of charge currents by way of providing rests for the battery cells 10 charged to SOC 30% at a temperature between 20° C. and 30° C. for a period of time between 12 and 24 hours, connecting the battery cells 10 to the measurement part 21 so that a series resistance is 1Ω or more, and supplying the charge currents to the battery cells 10 so that the voltages of the battery cells 10 are maintained constant in an environment of the temperature between 20° C. and 30° C.

Figure 12:
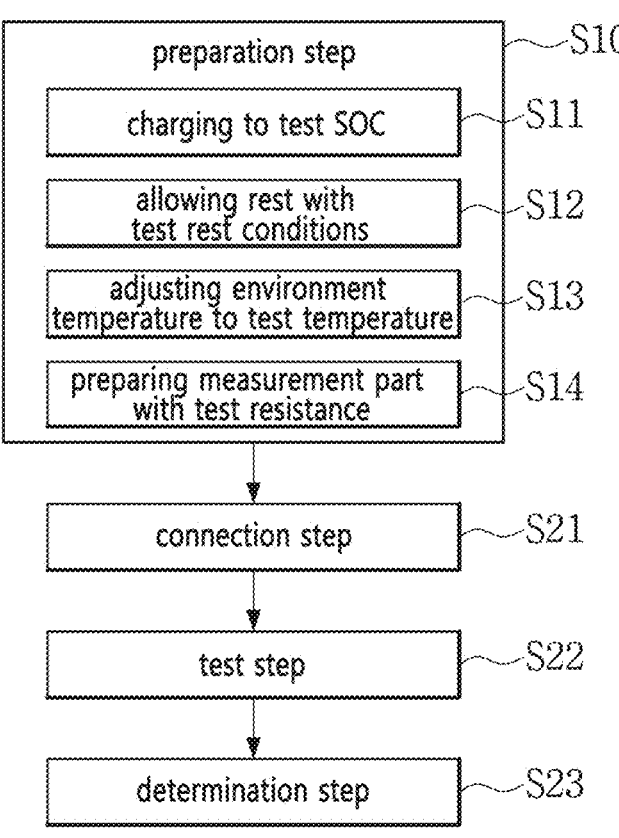
FIG. 12 is a flowchart illustrating a method for detecting a defective battery cell according to the embodiment.

FIG. 12 is a flowchart illustrating a method for detecting a defective battery cell according to the embodiment.

The method for detecting a defective battery cell according to the present disclosure may include: step S21 of connecting a battery cell 10 to a charger 22 and a measurement part 21; step S22 of testing for supplying charge current, by the charger 22, to cause the battery cell 10 to maintain a constant voltage and measuring the current charged to the battery cell 10 by the measurement part 21; and step S23 of determining, by a controller 23, whether a defect exists in the battery cell 10 on the basis of the current measured by the measurement part 21.

In addition, the method for detecting a defective battery cell may further include, before the connection step S21, step S10 of preparing to charge a battery cell 10 to a test SOC of 30%, setting a test temperature of the battery cell 10 between 20° C. and 30° ° C., preparing a series resistance between the battery cell 10 and the measurement part 21 to be 1Ω or more, and allowing the battery cell 10 to rest at the test temperature for a period of time between 12 and 24 hours after charging the battery cell 10 to the test SOC.

As described above, the preparation step S10 according to the embodiment may include: step S11 of charging a battery to the test SOC in order to perform the method for detecting a defective battery cell; step S12 of allowing the battery to rest under test resting conditions; step S13 of controlling a test environment at the test temperature; and step S14 of preparing to connect the battery cell to the measurement part with the test resistance. When the preparation step S10 is performed, the connection step S21 may be performed.

The connection step S21 is a process of connecting the battery cell 10 prepared according to the test conditions to the apparatus 20 for detecting a defective battery cell. The battery cell 10 may receive charge current from the charger 22, and may be connected to the measurement part 21 so as to measure a charge current magnitude.

The test step S22 is a process of supplying charge current to cause the battery cell 10 to maintain a constant voltage. When the test step S22 begins, the measurement part 21 may measure a present voltage of the battery cell 10, and the charger 22 may charge the battery cell 10 with the charge current capable of maintaining the measured voltage. The measurement part 21 may continuously measure the voltage of the battery cell 10, and the charger 22 may adjust the charge current so that the measured voltage is not larger or smaller than an initially input voltage.

The determination step S23 is a process of determining, by the controller 23, whether or not a defect exists in the battery cell 10 by using the charge current magnitude measured by the measurement part 21. In the determining whether a defect exists, the controller 23 may determine that the defect exists in the battery cell 10 in a case where the charge current magnitude measured by the measurement part 21 is greater than or equal to a reference value. Alternatively, in the determining whether a defect exists, the controller 23 may store charge current magnitudes measured by the measurement part over time and determine that a defect exist in the battery cell in a case where a difference greater than or equal to a predetermined standard occurs through a comparison with an electric current graph of a normal battery cell.

The present disclosure has been described in detail through specific embodiments. The embodiments are provided to specifically describe the present disclosure, but the present disclosure is not limited thereto. Within the technical spirit of the present disclosure, it will be apparent that modifications or improvements are possible by those skilled in the art.

All simple modifications or changes of the present disclosure fall within the scope of the present disclosure, and the specific scope of protection of the present disclosure will be made clear by the appended claims.

What is claimed is:

1. An apparatus for detecting a defective battery cell, the apparatus comprising:
   a charger for supplying a charge current to cause a battery cell to maintain an initial voltage during a test process;
   a measurement part for measuring the voltage and the charge current of the battery cell; and
   a controller for determining whether a defect exists in the battery cell on the basis of the charge current measured by the measurement part,
   wherein the charge current reflects a leakage current of the battery cell.

2. The apparatus of claim 1, wherein a test state of charge (SOC) of the battery cell is between 20% and 40%.

3. The apparatus of claim 1, wherein a test temperature of the battery cell is between 20° C. and 30° C.

4. The apparatus of claim 1, wherein a series resistance between the battery cell and the measurement part is 1Ω or more.

5. The apparatus of claim 1, wherein the battery cell is charged to a test state of charge (SOC) and then allowed to rest at a test temperature for 12 to 24 hours.

6. The apparatus of claim 1, wherein the controller determines that the defect exists in the battery cell in a case where a magnitude of the charge current measured by the measurement part is greater than a reference value.

7. The apparatus of claim 1, wherein the controller stores magnitudes of the charge current measured by the measurement part over time and determines that the defect exists in the battery cell in a case where a difference greater than or equal to a predetermined standard occurs by a comparison with an electric current graph of a normal battery cell.

8. A method for detecting a defective battery cell, the method comprising:
   connecting a battery cell to a charger and a measurement part;
   testing for supplying a charge current, by the charger, to cause the battery cell to maintain an initial voltage during a test process and measuring the charge current charged in the battery cell by the measurement part; and
   determining, by a controller, whether a defect exists in the battery cell on the basis of the charge current measured by the measurement part,
   wherein the charge current reflects a leakage current of the battery cell.

9. The method of claim 8, further comprising, before the connecting a battery cell:
   preparing for charging the battery cell to a test state of charge (SOC) between 20% and 40%.

10. The method of claim 8, further comprising, before the connecting a battery cell:
   preparing for adjusting a test temperature of the battery cell to between 20° C. and 30° C.

11. The method of claim 8, further comprising, before the connecting a battery cell:
   preparing a series resistance between the battery cell and the measurement part to be 1Ω or more.

12. The method of claim 8, further comprising, before the connecting a battery cell:
   preparing for allowing the battery cell to rest at a test temperature for 12 to 24 hours after charging the battery cell to a test state of charge (SOC).

13. The method of claim 8, wherein, in the determining whether a defect exists, the controller determines that the defect exists in the battery cell in a case where a magnitude of the charge current measured by the measurement part is greater than a reference value.

14. The method of claim 8, wherein, in the determining whether a defect exists, the controller stores magnitudes of the charge current measured by the measurement part over time, and determines that the defect exists in the battery cell in a case where a difference greater than or equal to a predetermined standard occurs by a comparison with an electric current graph of a normal battery cell.

* * * * *